US012245462B2

(12) United States Patent
Yun et al.

(10) Patent No.: US 12,245,462 B2
(45) Date of Patent: Mar. 4, 2025

(54) DISPLAY DEVICE

(71) Applicant: SAMSUNG DISPLAY CO., LTD., Yongin-si (KR)

(72) Inventors: Suyeon Yun, Yongin-si (KR); Okkyung Park, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 469 days.

(21) Appl. No.: 17/554,538

(22) Filed: Dec. 17, 2021

(65) Prior Publication Data

US 2022/0199729 A1 Jun. 23, 2022

(30) Foreign Application Priority Data

Dec. 21, 2020 (KR) .................. 10-2020-0179920

(51) Int. Cl.
*H01L 27/32* (2006.01)
*H10K 59/121* (2023.01)
*H10K 59/131* (2023.01)
*H10K 59/88* (2023.01)

(52) U.S. Cl.
CPC ....... *H10K 59/1213* (2023.02); *H10K 59/131* (2023.02); *H10K 59/88* (2023.02)

(58) Field of Classification Search
CPC ............. H10K 59/131; H10K 59/1213; H10K 59/124; H10K 59/126; H10K 59/65; H10K 59/88; H10K 59/8792; H10K 50/865; H10K 59/8791; H10K 59/40; H10K 59/10–221;

(Continued)

(56) References Cited

U.S. PATENT DOCUMENTS

| 2017/0162637 A1* | 6/2017 | Choi | G09G 3/3225 |
| 2018/0040682 A1* | 2/2018 | Ebisuno | H10K 59/1213 |
| 2019/0115407 A1* | 4/2019 | Cho | H10K 59/1213 |

(Continued)

FOREIGN PATENT DOCUMENTS

| CN | 109375437 A | 2/2019 |
| KR | 1020200077477 A | 6/2020 |

(Continued)

*Primary Examiner* — Shahed Ahmed
*Assistant Examiner* — Rhys Poniente Sheker
(74) *Attorney, Agent, or Firm* — CANTOR COLBURN LLP

(57) ABSTRACT

A display device includes: a substrate including an opening area, a display area, and a non-display area arranged between the opening area and the display area; a first thin-film transistor arranged on the substrate and including a first semiconductor layer including a silicon semiconductor; a first insulating layer covering the first semiconductor layer and defining a lower contact hole overlapping the non-display area, a second thin-film transistor arranged on the first insulating layer and including a second semiconductor layer including an oxide semiconductor; a second insulating layer covering the second semiconductor layer and defining an upper contact hole overlapping the lower contact hole; a display element overlapping the display area, a lower conductive layer overlapping the lower contact hole; and an upper conductive layer arranged on the second insulating layer and connected to the lower conductive layer through the lower contact hole and the upper contact hole.

18 Claims, 16 Drawing Sheets

(58) Field of Classification Search
CPC ........... H10K 50/00–88; H10K 27/124; H10K 27/1248; H10K 27/1225; H10K 27/1218
See application file for complete search history.

(56) References Cited

U.S. PATENT DOCUMENTS

| | | |
|---|---|---|
| 2020/0258952 A1 | 8/2020 | Bok et al. |
| 2020/0303677 A1 | 9/2020 | Lee et al. |
| 2020/0395427 A1 | 12/2020 | Kim et al. |
| 2021/0202596 A1* | 7/2021 | Wang .................. H10K 59/124 |

FOREIGN PATENT DOCUMENTS

| | | |
|---|---|---|
| KR | 1020200098742 A | 8/2020 |
| KR | 1020200113092 A | 10/2020 |

* cited by examiner

DISPLAY DEVICE

This application claims priority to Korean Patent Application No. 10-2020-0179920, filed on Dec. 21, 2020, and all the benefits accruing therefrom under 35 U.S.C. § 119, the content of which in its entirety is herein incorporated by reference.

BACKGROUND

1. Field

One or more embodiments relate to a display device.

2. Description of the Related Art

In general, a display device includes display elements and pixel circuits for controlling electrical signals applied to the display elements. The pixel circuits may include thin-film transistors ("TFTs") and storage capacitors.

The number of thin-film transistors electrically connected to one display element has been increased in order to accurately control whether the display element emits light and the degree of light emission. Accordingly, research to solve the problem of high integration and power consumption of the display device is actively in progress.

In addition, the usage of the display device has diversified. As an area occupied by a display area of the display device increases, various functions that are combined or associated with the display device are being added. As a way of adding various functions while increasing an area, research into the display device having a display area surrounding an opening area is in progress. In such a display device, light may penetrate in a direction from the opening area to the display area, thereby affecting the reliability of the display device.

SUMMARY

One or more embodiments include a display device having improved reliability and a display area surrounding an opening area.

In particular, one or more embodiments include a display device in which the deterioration of a thin-film transistor including an oxide semiconductor arranged around an opening area is prevented or reduced.

Additional aspects will be set forth in part in the description which follows and, in part, will be apparent from the description, or may be learned by practice of the presented embodiments of the disclosure.

According to one or more embodiments, a display device includes: a substrate including an opening area, a display area surrounding the opening area, and a non-display area arranged between the opening area and the display area; a first thin-film transistor arranged on the substrate and including a first semiconductor layer including a silicon semiconductor; a first insulating layer covering the first semiconductor layer and defining a lower contact hole, where the lower contact hole overlaps the non-display area in a plan view; a second thin-film transistor arranged on the first insulating layer and including a second semiconductor layer including an oxide semiconductor; a second insulating layer covering the second semiconductor layer and defining an upper contact hole, where the upper contact hole overlaps the lower contact hole in the plan view; a display element overlapping the display area in the plan view and arranged on the second insulating layer; a lower conductive layer arranged between the substrate and the first insulating layer and overlapping the lower contact hole; and an upper conductive layer arranged on the second insulating layer and connected to the lower conductive layer through the lower contact hole and the upper contact hole.

The first thin-film transistor may be arranged between the second thin-film transistor and the opening area.

The display device may further include a buffer layer arranged between the substrate and the first semiconductor layer, and a first gate insulating layer covering the first semiconductor layer and arranged under the first insulating layer. The lower conductive layer may include at least one of a first lower conductive layer and a second lower conductive layer, the first lower conductive layer may be arranged between the substrate and the buffer layer, and the second lower conductive layer may be arranged between the first gate insulating layer and the first insulating layer.

The display device may further include: a first organic insulating layer arranged between the second insulating layer and the display element, and a second organic insulating layer arranged between the first organic insulating layer and the display element. The upper conductive layer may include at least one of a first upper conductive layer and a second upper conductive layer, the first upper conductive layer may be arranged between the second insulating layer and the first organic insulating layer, and the second upper conductive layer may be arranged between the first organic insulating layer and the second organic insulating layer.

The first upper conductive layer and the second upper conductive layer may each be provided in plural, and the first upper conductive layer and the second upper conductive layer may be alternately arranged in a direction from the display area to the opening area.

The first organic insulating layer may define a hole arranged between two adjacent second upper conductive layers from among the plurality of second upper conductive layers, and the two adjacent second upper conductive layers may have a pair of protruding tips protruding toward a center of the hole of the first organic insulating layer.

The display device may further include an encapsulation layer covering the display element and including at least one inorganic encapsulation layer and at least one organic encapsulation layer. The display element may include a first electrode arranged on the second organic insulating layer, an intermediate layer including an emission layer, and a second electrode. The intermediate layer may further include at least one of a first functional layer arranged between the first electrode and the emission layer and a second functional layer arranged between the emission layer and the second electrode. At least one of the first functional layer and the second functional layer may be disconnected by the hole, and the inorganic encapsulation layer may be in direct contact with the pair of protruding tips.

The upper conductive layer may include an upper detour line extending to surround at least part of the opening area, and the lower conductive layer may include a lower detour line extending to surround at least part of the opening area.

The upper conductive layer may include an upper wiring line extending from the display area to the non-display area and electrically connected to one of the first thin-film transistor and the second thin-film transistor, and the lower conductive layer may include a lower wiring line extending to surround at least part of the opening area and be electrically connected to the upper conductive layer in the non-display area.

The upper conductive layer may include an upper connection line that transmits an initialization voltage, and the lower conductive layer may include a lower connection line electrically connected to the upper connection line, and the upper connection line and the lower connection line may extend to surround at least part of the opening area.

The lower conductive layer may include a dummy semiconductor layer including a silicon semiconductor.

The display device may further include: an intermediate insulating layer arranged between the first insulating layer and the second insulating layer; a wiring line arranged between the intermediate insulating layer and the second insulating layer in the display area; and a lower electrode layer arranged between the substrate and the second semiconductor layer, where the lower electrode layer and the wiring line may be electrically connected to each other through a hole in the first insulating layer and a hole in the intermediate insulating layer.

The display device may further include a component overlapping the opening area in the plan view.

According to one or more embodiments, a display device includes: a substrate including an opening area, a display area surrounding the opening area, and a non-display area arranged between the opening area and the display area; a pixel circuit arranged on the display area; a display element electrically connected to the pixel circuit; and a light-blocking structure arranged on the non-display area and surrounding at least a portion of the opening area, where the pixel circuit includes a first thin-film transistor including a first semiconductor layer including a silicon semiconductor and a second thin-film transistor including a second semiconductor layer including an oxide semiconductor.

The display device may further include: a first insulating layer covering the first semiconductor layer, arranged under the second semiconductor layer, and defining a lower contact hole, where the lower contact hole may overlap the non-display area in a plan view; and a second insulating layer covering the second semiconductor layer and defining an upper contact hole, where the upper contact hole may overlap the lower contact hole. The light-blocking structure may include: a lower conductive layer arranged between the substrate and the first insulating layer and overlapping the lower contact hole; and an upper conductive layer arranged on the second insulating layer and connected to the lower conductive layer through the lower contact hole and the upper contact hole.

The display area may include a first display area surrounding the opening area and a second display area surrounding the first display area, the pixel circuit may include a first pixel circuit arranged in the first display area and a second pixel circuit arranged in the second display area, the first pixel circuit may include a first adjacent thin-film transistor including a first adjacent semiconductor layer including a silicon semiconductor and a second adjacent thin-film transistor including a second adjacent semiconductor layer including an oxide semiconductor, and the first adjacent thin-film transistor may be arranged closer to the opening area than the second adjacent thin-film transistor. The display device may further include: an intermediate insulating layer arranged between the first insulating layer and the second insulating layer; a wiring line arranged between the intermediate insulating layer and the second insulating layer in the first display area; and a lower electrode layer arranged between the substrate and the second adjacent semiconductor layer, and the lower electrode layer and the wiring line may be electrically connected to each other through a hole in the first insulating layer and a hole in the intermediate insulating layer.

The pixel circuit may be provided in plural, and the light-blocking structure may include a connection line electrically connected to each of pixel circuits adjacent to the connection line and from among the plurality of pixel circuits.

The light-blocking structure may include a detour line surrounding at least a portion of the opening area.

The light-blocking structure may include a dummy circuit arranged on the non-display area and including a dummy thin-film transistor, and the dummy thin-film transistor may include a dummy semiconductor layer including a silicon semiconductor.

The display device may further include: an upper wiring line extending from the pixel circuit to the non-display area; and a detour line surrounding at least part of the opening area. The light-blocking structure may be a structure that electrically connects the upper wiring line to the detour line.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
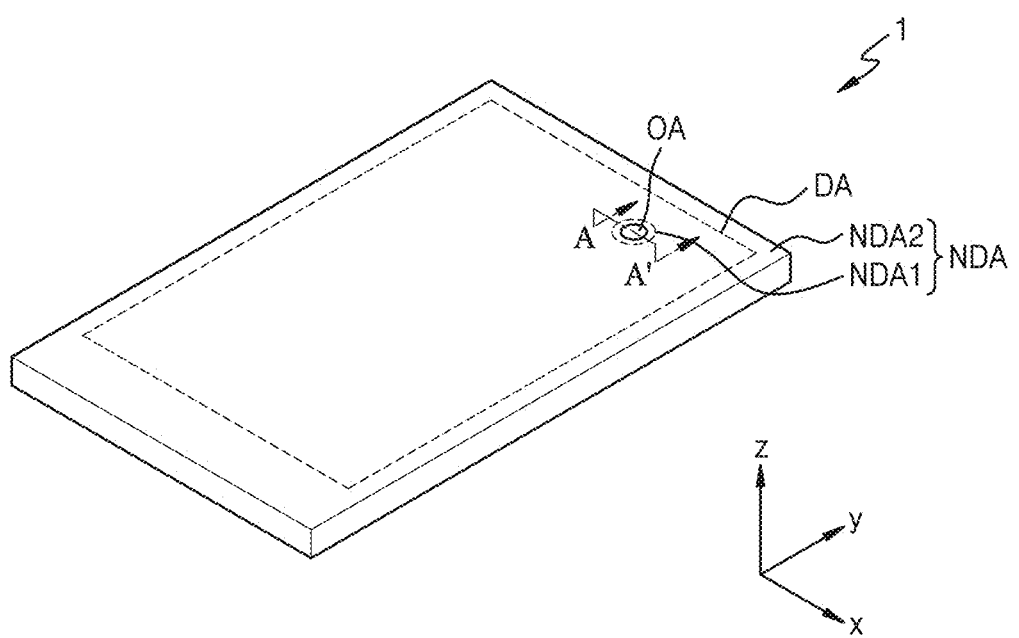
FIG. 1 is a schematic perspective view of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

The embodiments will be described below in more detail with reference to the accompanying drawings. Those components that are the same or are in correspondence are rendered the same reference numeral regardless of the figure number, and redundant explanations are omitted.

It will be understood that although the terms "first," "second," etc. may be used herein to describe various elements, these elements should not be limited by these terms. These elements are only used to distinguish one element from another.

As used herein, the singular forms "a," "an," and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "formed/disposed on" another layer, region, or element, it can be directly or indirectly formed/disposed on the other layer, region, or element. That is, for example, intervening layers, regions, or elements may be present. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Sizes of components in the drawings may be exaggerated for convenience of explanation. In other words, since sizes and thicknesses of components in the drawings are arbitrarily illustrated for convenience of explanation, the following embodiments according to the invention are not limited thereto.

When a certain embodiment may be implemented differently, a specific process order may be performed differently from the described order. For example, two consecutively described processes may be performed substantially at the same time or performed in an order opposite to the described order.

In the following embodiments, when layers, regions, or elements are connected to each other, the layers, the regions, or the elements may be directly connected to each other, or another layer, another region, or another element may be interposed between the layers, the regions, or the elements and thus the layers, the regions, or the elements may be indirectly connected to each other. For example, in the following embodiments, when layers, regions, or elements are electrically connected to each other, the layers, the regions, or the elements may be directly electrically connected to each other, or another layer, another region, or another element may be interposed between the layers, the regions, or the elements and thus the layers, the regions, or the elements may be indirectly electrically connected to each other.

Display devices may display images, and may be included in portable electronic devices such as game consoles, multimedia devices, and micro personal computers ("PCs"). Examples of the display devices may include a liquid crystal display, an electrophoretic display, an organic light-emitting display, an inorganic electroluminescent ("EL") display (i.e., an inorganic light-emitting display), a field emission display, a surface-conduction electron-emitter display, a quantum dot display, a plasma display, a cathode ray display, or the like. Hereinafter, as a display device according to an embodiment, an organic light-emitting display will be described as an example. However, various types of display devices as described above may be used in embodiments.

FIG. 1 is a schematic perspective view of a display device 1 according to an embodiment.

Referring to FIG. 1, the display device 1 may include a display area DA, a non-display area NDA, and an opening area OA. The display area DA may emit light. A plurality of pixels may be arranged in the display area DA, and the display device 1 may provide a certain image by using light emitted from the plurality of pixels. The non-display area NDA may not emit light. The non-display area NDA may be arranged adjacent to the display area DA.

The opening area OA may include an opening 10H (See FIG. 2) and not emit light. The opening area OA may be an area overlapping a component 30 (See FIG. 2) to be described later. The opening area OA may be at least partially surrounded by the display area DA. In an embodiment, the opening area OA may be entirely surrounded by the display area DA.

The non-display area NDA may include a first non-display area NDA1 and a second non-display area NDA2. The first non-display area NDA1 may surround the opening area OA. The second non-display area NDA2 may surround at least part of the display area DA. In an embodiment, the first non-display area NDA1 may entirely surround the opening area OA. The display area DA may surround the entire first non-display area NDA1. The second non-display area NDA2 may entirely surround the display area DA.

Figure 2:
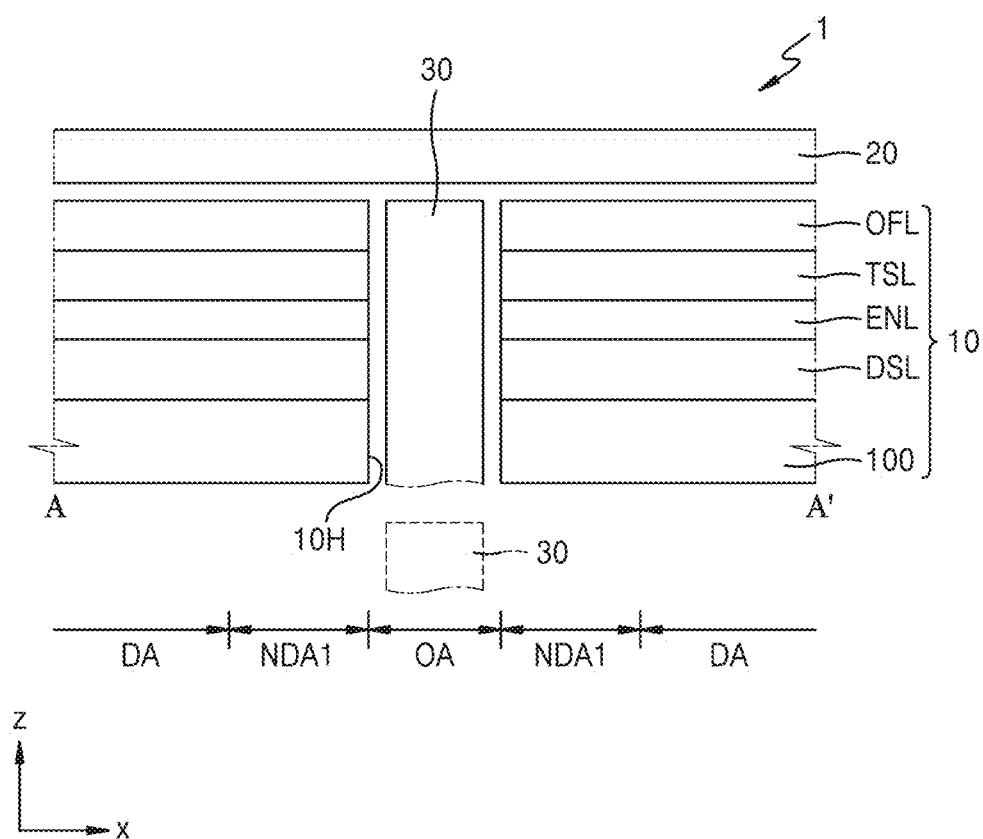
FIG. 2 is a schematic cross-sectional view of a display device according to an embodiment.

FIG. 2 is a schematic cross-sectional view of a display device 1 according to an embodiment. FIG. 2 may be a cross-sectional view of the display device 1 taken along line A-A' of FIG. 1.

Referring to FIG. 2, the display device 1 may include a display panel 10, a cover window 20, and a component 30. The display panel 10 may display an image. The display panel 10 may include pixels arranged in a display area DA. Each of the pixels may include a display element and a pixel circuit connected thereto. The display element may include an organic light-emitting diode, an inorganic light-emitting diode, or a quantum dot light-emitting diode. Hereinafter, a detailed description will be given focusing on a case where the display element includes an organic light-emitting diode.

The display panel 10 may include a substrate 100 and a multilayer film arranged on the substrate 100. In this case, a display area DA, a first non-display area NDA1, and an opening area OA may be defined in the substrate 100 and/or the multilayer film. For example, the substrate 100 may include the display area DA, the first non-display area NDA1, and the opening area OA. Hereinafter, a detailed description will be given focusing on a case where the display area DA, the first non-display area NDA1, and the opening area OA are defined in the substrate 100.

In an embodiment, the display panel 10 may include the substrate 100, a display layer DSL, an encapsulation layer ENL, a touch sensor layer TSL, and an optical functional layer OFL. The substrate 100 may be glass or may include a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate. In an embodiment, the substrate 100 may have a multilayer structure including a base layer including the aforementioned polymer resin and a barrier layer (not shown). The substrate 100 including the polymer resin may have flexible, rollable, and bendable characteristics.

The display layer DSL may be arranged on the substrate 100. The display layer DSL may include a pixel circuit layer including a plurality of pixel circuits and a display element layer including a plurality of display elements. In this case, the plurality of pixel circuits may be connected to the plurality of display elements, respectively. Each of the pixel circuits may include a thin-film transistor and a storage capacitor. Accordingly, the display layer DSL may include a plurality of display elements, a plurality of thin-film transistors, and storage capacitors. In addition, the display layer DSL may further include insulating layers therebetween.

The encapsulation layer ENL may be arranged on the display layer DSL. The encapsulation layer ENL may be arranged on the display elements and may cover the display elements. In an embodiment, the encapsulation layer ENL may include at least one inorganic encapsulation layer and at least one organic encapsulation layer. The at least one inorganic encapsulation layer may include an inorganic material. The at least one organic encapsulation layer may include an organic material.

In another embodiment, the encapsulation layer ENL may have a structure in which the substrate 100 and an upper substrate, which is a transparent member, are combined with each other by a sealing member to seal an inner space between the substrate 100 and the upper substrate. In this case, a moisture absorbent or filler may be located in the inner space. The sealing member may be a sealant, and in another embodiment, the sealing member may include a material that is cured by a laser. For example, the sealing member may be a frit. Specifically, the sealing member may include a urethane-based resin, an epoxy-based resin, or an acrylic resin, which is an organic sealant, or silicone, which is an inorganic sealant. For example, urethane acrylate or the like may be used as the urethane-based resin. For example, butyl acrylate, ethylhexyl acrylate, or the like may be used as the acrylic resin. The sealing member may include a material that is cured by heat.

The touch sensor layer TSL may be arranged on the encapsulation layer ENL. The touch sensor layer TSL may sense coordinate information according to an external input, for example, a touch event. The touch sensor layer TSL may include a sensor electrode and touch wires connected to the sensor electrode. The touch sensor layer TSL may detect an external input by using a self-capacitive method or a mutual capacitive method.

The touch sensor layer TSL may be disposed on the encapsulation layer ENL. Alternatively, the touch sensor layer TSL may be separately formed on a touch substrate and then bonded onto the encapsulation layer ENL through an adhesive layer such as an optically transparent adhesive. In an embodiment, the touch sensor layer TSL may be formed directly on the encapsulation layer ENL, and in this case, the adhesive layer may not be between the touch sensor layer TSL and the encapsulation layer ENL.

The optical functional layer OFL may be arranged on the touch sensor layer TSL. The optical functional layer OFL may reduce the reflectance of light (external light) incident from the outside toward the display device 1 and/or improve the color purity of light emitted from the display device 1. In an embodiment, the optical functional layer OFL may include a retarder and a polarizer. The retarder may be of a film type or a liquid crystal coating type, and may include a λ/2 retarder and/or a λ/4 retarder. The polarizer may also be of a film type or a liquid crystal coating type. The film type may include a stretchable synthetic resin film, and the liquid crystal coating type may include liquid crystals arranged in a certain arrangement. The retarder and the polarizer may each further include a protective film.

In another embodiment, the optical functional layer OFL may include a black matrix and color filters. The color filters may be arranged considering the color of light emitted from each of the pixels of the display device 1. Each of the color filters may include a red, green, or blue pigment or dye. Alternatively, each of the color filters may further include quantum dots in addition to the pigment or dye described above. Alternatively, some of the color filters may not include the pigment or dye described above, and may include scattering particles such as titanium oxide.

In another embodiment, the optical functional layer OFL may include a destructive interference structure. The destructive interference structure may include a first reflective layer and a second reflective layer arranged on different layers. First reflected light and second reflected light reflected from the first reflective layer and the second reflective layer, respectively, may destructively interfere, and thus, the reflectance of external light may be reduced.

In an embodiment, the display panel 10 may define an opening 10H therein. In an embodiment, the substrate 100, the display layer DSL, the encapsulation layer ENL, the touch sensor layer TSL, and the optical functional layer OFL may define a first opening, a second opening, a third opening, a fourth opening, and a fifth opening, respectively. The first to fifth openings may overlap one another to form the opening 10H of the display panel 10 in a plan view. The first to fifth openings may overlap the opening area OA. In another embodiment, at least one of the substrate 100, the display layer DSL, the encapsulation layer ENL, the touch sensor layer TSL, and the optical functional layer OFL may not define an opening therein. For example, any one or two of the substrate 100, the display layer DSL, the encapsulation layer ENL, the touch sensor layer TSL, and the optical functional layer OFL may not define an opening.

The cover window 20 may be arranged on the display panel 10. The cover window 20 may protect the display panel 10. The cover window 20 may include at least one of glass, sapphire, and plastic. The cover window 20 may include, for example, ultra-thin tempered glass ("UTG") or colorless polyimide ("CPI").

The component 30 may overlap the opening area OA in a plan view. The component 30 may be positioned within the opening 10H of the display panel 10, as illustrated by the solid line in FIG. 2, or may be arranged below the display panel 10, as illustrated by the dashed line in FIG. 2.

The component 30 may include an electronic component. The component 30 may be an electronic element using light or sound. For example, the electronic element may be a sensor that receives and uses light, such as an infrared sensor, a camera that receives light and captures an image, a sensor that measures distance or recognizes fingerprints by outputting and detecting light or sound, or a small lamp that outputs light, or may include a speaker or the like that outputs sound. In the electronic element using light, light of various wavelength bands, such as visible light, infrared light, and ultraviolet light, may be used. In some embodiments, the opening 10H of the display panel 10 may be understood as a transmissive portion through which light or/and sound, which is output from the component 30 to the outside or travels from the outside toward the electronic element, may pass.

In another embodiment, when the display device 1 is used as a smart watch or an instrument panel for a vehicle, the component 30 may be a member including a clock hand, or a needle indicating certain information (e.g., vehicle speed, etc.). When the display device 1 includes a clock hand or an instrument panel for a vehicle, the component 30 may pass through the cover window 20 and be exposed to the outside, and the cover window 20 may define an opening overlapping the opening 10H of the display panel 10 in a plan view.

The component 30 may include component(s) related to the function of the display panel 10, as described above, or may include a component such as an accessory that increases the aesthetic sensibility of the display panel 10.

Figure 3A:
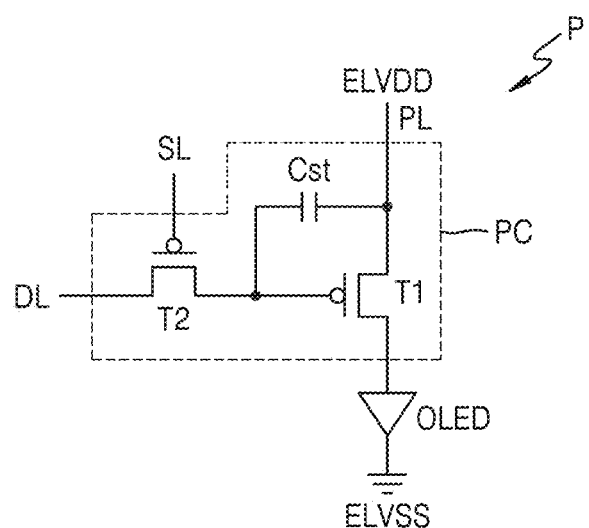
FIGS. 3A and 3B are equivalent circuit diagrams of a pixel that may be applied to a display panel.
Figure 3B:
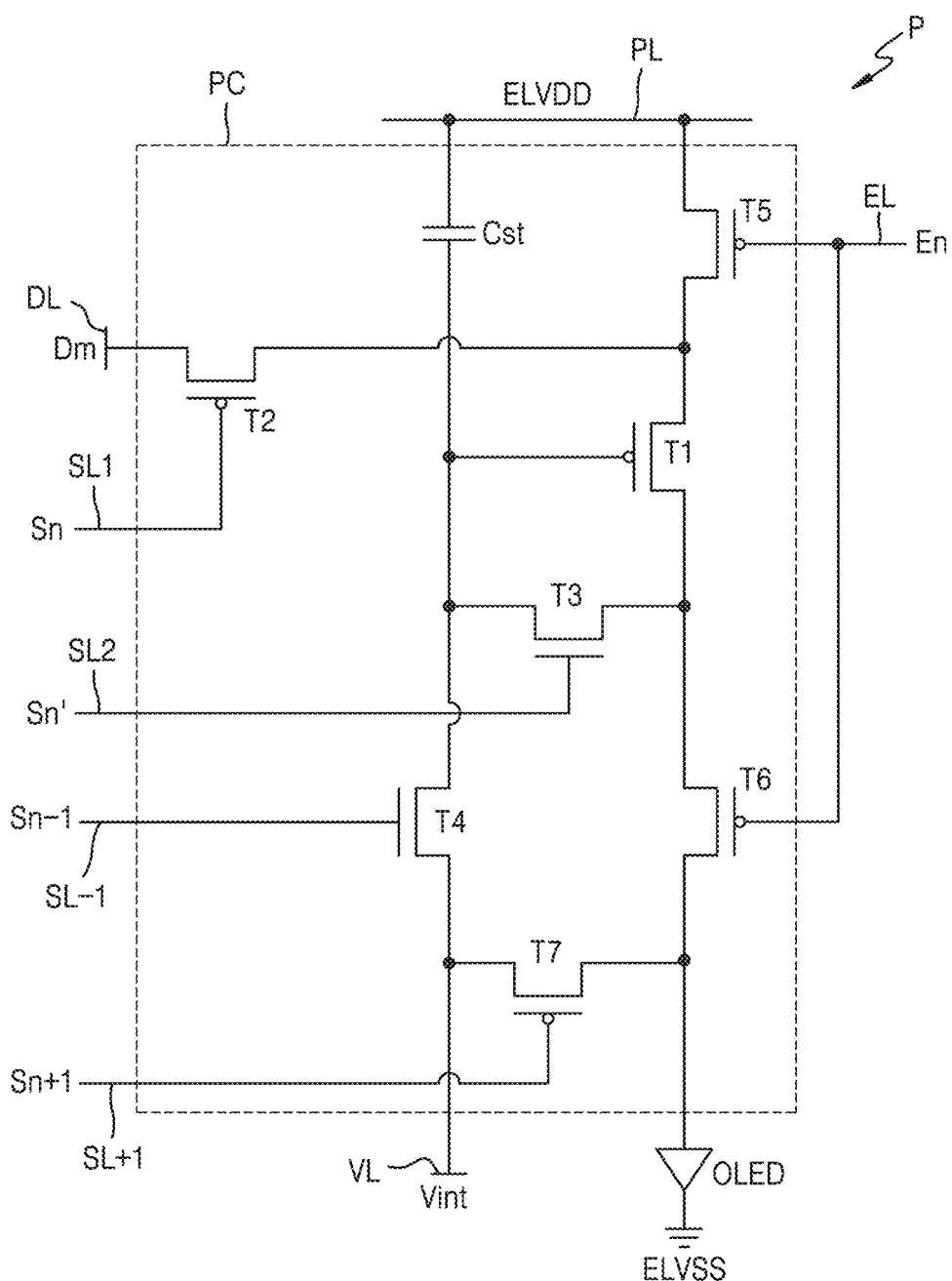

FIGS. 3A and 3B are equivalent circuit diagrams of a pixel P that may be applied to a display device.

Referring to FIGS. 3A and 3B, the pixel P may include a pixel circuit PC and a display element connected to the pixel circuit PC, for example, an organic light-emitting diode OLED.

Referring to FIG. 3A, in an embodiment, the pixel circuit PC may include a driving thin-film transistor T1, a switching thin-film transistor T2, and a storage capacitor Cst. The pixel P may emit red, green, or blue light, or may emit red, green, blue, or white light through the organic light-emitting diode OLED.

The switching thin-film transistor T2 is connected to a scan line SL and a data line DL, and may transmit a data signal or data voltage input through the data line DL to the driving thin-film transistor T1 based on a scan signal or switching voltage input through the scan line SL. The storage capacitor Cst is connected to the switching thin-film transistor T2 and a driving voltage line PL, and may store a voltage corresponding to a difference between a voltage received from the switching thin-film transistor T2 and a first power voltage ELVDD supplied to the driving voltage line PL.

The driving thin-film transistor T1 is connected to the driving voltage line PL and the storage capacitor Cst, and may control a driving current flowing through the organic light-emitting diode OLED from the driving voltage line PL in response to a voltage value stored in the storage capacitor Cst. The organic light-emitting diode OLED may emit light having a certain luminance according to the driving current. An opposite electrode (e.g., a cathode) of the organic light-emitting diode OLED may receive a second power voltage ELVSS.

Referring to FIG. 3B, in another embodiment, a pixel circuit PC may include a plurality of thin-film transistors, that is, a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7, and a storage capacitor Cst.

Although FIG. 3B illustrates a case where signal lines SL1, SL2, SL−1, SL+1, EL, and DL, an initialization voltage line VL, and a driving voltage line PL are provided for each pixel circuit PC, the disclosure according to the invention is not limited thereto. In another embodiment, at least one of the signal lines SL1, SL2, SL−1, SL+1, EL, and DL, and/or the initialization voltage line VL may be shared with neighboring pixel circuits.

Some of the plurality of thin-film transistors may be n-channel MOSFET ("NMOS"), and the rest of the plurality of thin-film transistors may be p-channel MOSFET ("PMOS"). In an embodiment, among the plurality of thin-film transistors, the compensation thin-film transistor T3 and the first initialization thin-film transistor T4 may be NMOS transistors, and the rest may be PMOS transistors. In another embodiment, among the plurality of thin-film transistors, the compensation thin-film transistor T3, the first initialization thin-film transistor T4, and the second initialization thin-film transistor T7 may be NMOS transistors, and the rest may be PMOS transistors. Alternatively, only one of the plurality of thin-film transistors may be an NMOS transistor and the rest of the plurality of thin-film transistors may be PMOS transistors. Alternatively, all of the plurality of thin-film transistors may be NMOS transistors.

The signal lines may include a first scan line SL1 that transmits a first scan signal Sn, a second scan line SL2 that transmits a second scan signal Sn', a previous scan line SL−1 that transmits a previous scan signal Sn−1 to the first initialization thin-film transistor T4, an emission control line EL that transmits an emission control signal En to the operation control thin-film transistor T5 and the emission control thin-film transistor T6, a subsequent scan line SL+1 that transmits a subsequent scan signal Sn+1 to the second initialization thin-film transistor T7, and a data line DL that crosses the first scan line SL1 and transmits a data signal Dm.

The driving voltage line PL may transmit a first power voltage ELVDD to the driving thin-film transistor T1, and the initialization voltage line VL may transmit an initialization voltage Vint for initializing the driving thin-film transistor T1 and a pixel electrode of an organic light-emitting diode OLED.

The gate electrode of the driving thin-film transistor T1 may be connected to the storage capacitor Cst. The source electrode of the driving thin-film transistor T1 may be connected to the driving voltage line PL via the operation control thin-film transistor T5. The drain electrode of the driving thin-film transistor T1 may be electrically connected to an organic light-emitting diode OLED via the emission control thin-film transistor T6. The driving thin-film transistor T1 may receive a data signal Dm according to a switching operation of the switching thin-film transistor T2 and supply a driving current to the organic light-emitting diode OLED.

The gate electrode of the switching thin-film transistor T2 may be connected to the first scan line SL1, and the source electrode of the switching thin-film transistor T2 may be connected to the data line DL. The drain electrode of the switching thin-film transistor T2 may be connected to the source electrode of the driving thin-film transistor T1 and may be connected to the driving voltage line PL via the operation control thin-film transistor T5. The switching thin-film transistor T2 may be turned on according to the first scan signal Sn received through the first scan line SL1 and perform a switching operation for transmitting the data signal Dm transmitted to the data line DL to the source electrode of the driving thin-film transistor T1.

The gate electrode of the compensation thin-film transistor T3 may be connected to the second scan line SL2. The drain electrode of the compensation thin-film transistor T3 may be connected to the drain electrode of the driving thin-film transistor T1 and may be connected to the pixel electrode of the organic light-emitting diode OLED via the emission control thin-film transistor T6. The source electrode of the compensation thin-film transistor T3 may be connected to one electrode of the storage capacitor Cst, the drain electrode of the first initialization thin-film transistor T4, and the gate electrode of the driving thin-film transistor T1. The compensation thin-film transistor T3 may be turned on according to the second scan signal Sn' received through the second scan line SL2 to connect the gate electrode and the drain electrode of the driving thin-film transistor T1 to each other, and thus, the driving thin-film transistor T1 may be diode-connected.

The gate electrode of the first initialization thin-film transistor T4 may be connected to a previous scan line SL−1. The source electrode of the first initialization thin-film transistor T4 may be connected to the initialization voltage line VL. The drain electrode of the first initialization thin-film transistor T4 may be connected to one electrode of the storage capacitor Cst, the source electrode of the compensation thin-film transistor T3, and the gate electrode of the driving thin-film transistor T1. The first initialization thin-film transistor T4 may be turned on according to the previous scan signal Sn−1 received through the previous scan line SL−1 and transmit an initialization voltage Vint to the gate electrode of the driving thin-film transistor T1 to perform an initialization operation for initializing a voltage of the gate electrode of the driving thin-film transistor T1.

The gate electrode of the operation control thin-film transistor T5 may be connected to the emission control line EL. The source electrode of the operation control thin-film transistor T5 may be connected to the driving voltage line PL. The drain electrode of the operation control thin-film transistor T5 may be connected to the source electrode of the driving thin-film transistor T1 and the drain electrode of the switching thin-film transistor T2.

The gate electrode of the emission control thin-film transistor T6 may be connected to the emission control line EL. The source electrode of the emission control thin-film transistor T6 may be connected to the drain electrode of the driving thin-film transistor T1 and the source electrode of the compensation thin-film transistor T3. The drain electrode of the emission control thin-film transistor T6 may be electrically connected to the pixel electrode of the organic light-emitting diode OLED. The operation control thin-film transistor T5 and the emission control thin-film transistor T6 may be simultaneously turned on according to the emission control signal En received through the emission control line EL, and thus, the first power voltage ELVDD may be transmitted to the organic light-emitting diode OLED and a driving current may flow through the organic light-emitting diode OLED.

The gate electrode of the second initialization thin-film transistor T7 may be connected to the subsequent scan line SL+1. The source electrode of the second initialization thin-film transistor T7 may be connected to the pixel electrode of the organic light-emitting diode OLED. The drain electrode of the second initialization thin-film transistor T7 may be connected to the initialization voltage line VL. The second initialization thin-film transistor T7 may be turned on according to a subsequent scan signal Sn+1 received through the subsequent scan line SL+1 to initialize the pixel electrode of the organic light-emitting diode OLED.

In FIG. 3B, the first initialization thin-film transistor T4 and the second initialization thin-film transistor T7 are connected to the previous scan line SL−1 and the subsequent scan line SL+1, respectively. However, the disclosure according to the invention is not limited thereto. In another embodiment, both the first initialization thin-film transistor T4 and the second initialization thin-film transistor T7 may be connected to the previous scan line SL−1 and driven according to the previous scan signal Sn−1.

The other electrode of the storage capacitor Cst may be connected to the driving voltage line PL. One electrode of the storage capacitor Cst may be connected to the gate electrode of the driving thin-film transistor T1, the source electrode of the compensation thin-film transistor T3, and the drain electrode of the first initialization thin-film transistor T4.

In some embodiments, the pixel circuit PC may further include a boost capacitor. Any one electrode of the boost capacitor may be connected to the gate electrode of the switching thin-film transistor T2 and the first scan line SL1. The other electrode of the boost capacitor may be connected to the source electrode of the compensation thin-film transistor T3.

The opposite electrode (e.g., a cathode) of the organic light-emitting diode OLED may be supplied with the second power voltage ELVSS. The organic light-emitting diode OLED may emit light by receiving a driving current from the driving thin-film transistor T1.

The pixel circuit PC is not limited to a circuit design and the number of thin-film transistors and storage capacitors described with reference to FIGS. 3A and 3B, and the numbers of thin-film transistors and storage capacitors and the circuit design may vary.

In an embodiment, the plurality of thin-film transistors may be silicon-based thin-film transistors including a silicon semiconductor. In another embodiment, at least one of the plurality of thin-film transistors may include an oxide-based thin-film transistor including an oxide semiconductor, and the rest of the plurality of thin-film transistors may include a silicon-based thin-film transistor including a silicon semiconductor.

In an embodiment, the driving thin-film transistor T1 may be a silicon-based thin-film transistor including a silicon semiconductor layer made of polycrystalline silicon having high reliability, thereby implementing a high-resolution display device.

Because the oxide semiconductor has high carrier mobility and low leakage current, a voltage drop is not large even though a driving time is long. That is, even during low-frequency driving, a color change of an image due to the voltage drop is not large, and thus, low-frequency driving may be performed. Because the oxide semiconductor has an advantage of having a small leakage current as described above, at least one of the compensation thin-film transistor T3 and the first initialization thin-film transistor T4 each connected to the gate electrode of the driving thin-film transistor T1 may include an oxide semiconductor to thereby effectively prevent leakage current that may flow to the gate electrode of the driving thin-film transistor T1 and reduce power consumption.

Figure 4:
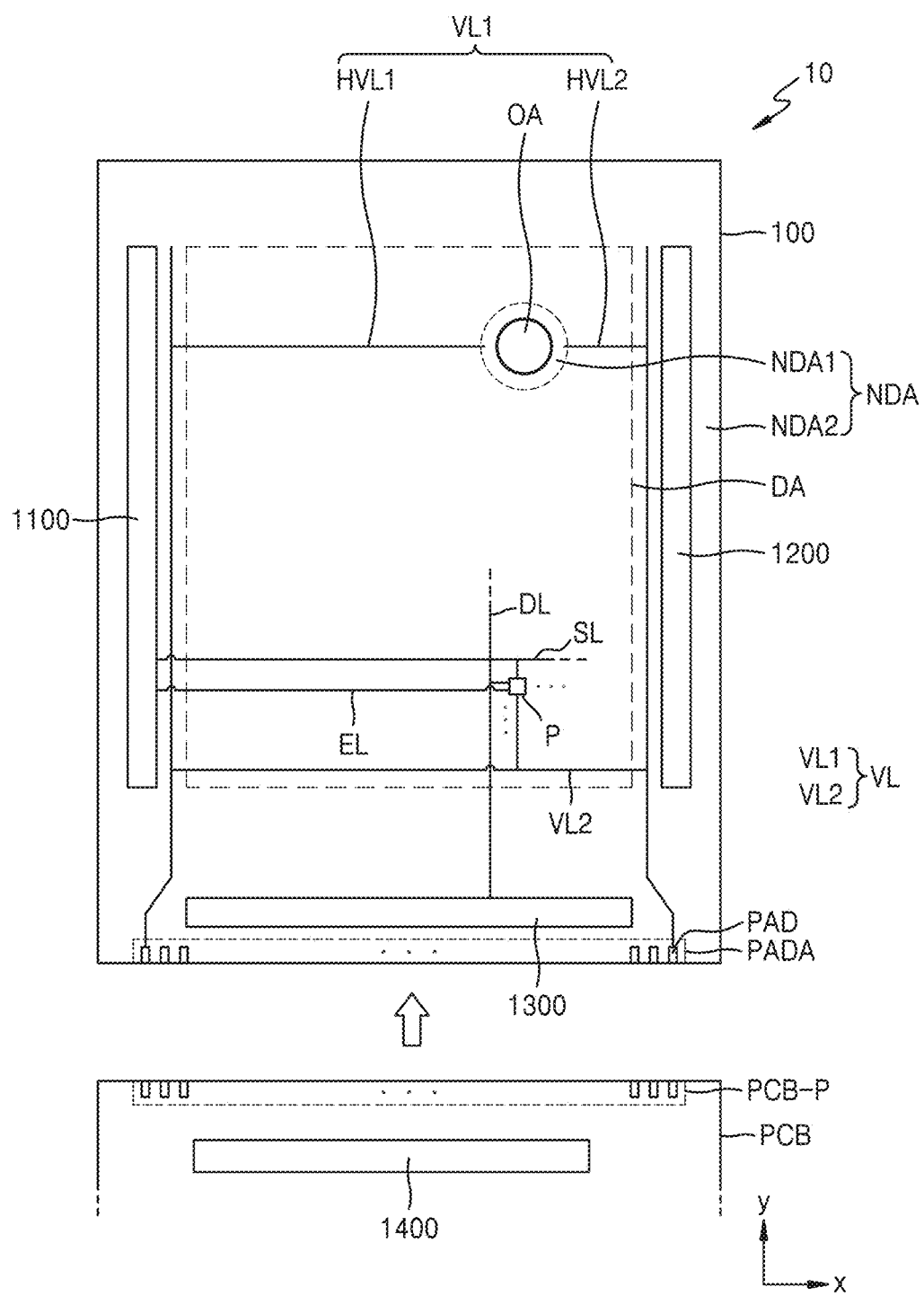
FIG. 4 is a schematic plan view of a display panel according to an embodiment.

FIG. 4 is a schematic plan view of a display panel 10 according to an embodiment.

Referring to FIG. 4, the display panel 10 may include an opening area OA, a display area DA, and a non-display area NDA. The opening area OA, the display area DA, and the non-display area NDA may be defined in a substrate 100 of the display panel 10. Hereinafter, a detailed description will be given focusing on a case where the substrate 100 includes the opening area OA, the display area DA, and the non-display area NDA.

The opening area OA may be surrounded by the display area DA. The opening area OA may be an area overlapping a component in a plan view. Although FIG. 4 illustrates that the opening area OA is on the upper right side of the display panel 10, the opening area OA may be arranged in various positions. For example, the opening area OA may be at the center of the display area DA in a first direction (e.g., an x direction or a −x direction). FIG. 4 illustrates that one opening area OA is arranged in the display panel 10. However, in another embodiment, a plurality of opening areas OA may be provided in the display area DA.

The display area DA may surround the opening area OA. A plurality of pixels P may be arranged in the display area DA. That is, the display panel 10 may include a plurality of pixels P arranged in the display area DA. As described with reference to FIGS. 3A and 3B, each of the plurality of pixels P may include a pixel circuit and a display element (e.g., an organic light-emitting diode) connected to the pixel circuit.

The non-display area NDA may include a first non-display area NDA1 and a second non-display area NDA2. The first non-display area NDA1 may surround the opening area OA. The first non-display area NDA1 may be an area in which no display elements such as an organic light-emitting diode emitting light are arranged. In the first non-display area NDA1, a signal line, which provides a signal to the pixels P arranged around the opening area OA, or a voltage wire may pass.

A first driver 1100 and a second driver 1200 that provide a scan signal or an emission control signal to each pixel P may be arranged in the second non-display area NDA2. A data driver 1300 providing a data signal to each pixel P may be arranged in the second non-display area NDA2. The second non-display area NDA2 may include a pad area PADA in which a plurality of pads PAD is arranged. The plurality of pads PAD may be electrically connected to terminals of a circuit board terminal portion PCB-P.

The first driver 1100 and the second driver 1200 may face each other with the display area DA therebetween. The first driver 1100 and the second driver 1200 may be connected to a scan line SL and/or an emission control line EL connected to each pixel P.

The scan line SL may provide a scan signal to the pixel P. The scan line SL may extend from the first driver 1100 or the second driver 1200 in the first direction (e.g., the x direction or the −x direction).

The emission control line EL may provide an emission control signal to the pixel P. The emission control line EL may extend from the first driver 1100 or the second driver 1200 in the first direction (e.g., the x direction or the −x direction).

In an embodiment, the data driver 1300 may be arranged adjacent to one side of the substrate 100. That is, the data driver 1300 may be arranged adjacent to the edge of the display panel 10. In another embodiment, the data driver 1300 may be arranged on a printed circuit board PCB. Hereinafter, a detailed description will be given focusing on a case where the data driver 1300 is arranged adjacent to one side of the substrate 100.

The data line DL may provide a data signal to the pixel P. A data line DL may extend from the data driver 1300 in a second direction (e.g., a y direction or a −y direction).

In an embodiment, a power supply portion 1400 may be arranged on the printed circuit board PCB. The power supply portion 1400 may provide the first power voltage ELVDD (see FIG. 3B), the second power voltage ELVSS (see FIG. 3B), and the initialization voltage Vint (see FIG. 3B) to each pixel P. In another embodiment, the power supply portion 1400 may be arranged in the second non-display area NDA2.

An initialization voltage line VL may be connected to the pad PAD. The initialization voltage line VL may extend in the second direction (e.g., the y direction or the −y direction) in the second non-display area NDA2. The initialization voltage line VL may extend between the first driver 1100 and the display area DA and/or between the second driver 1200 and the display area DA.

The initialization voltage line VL may transmit the initialization voltage Vint provided from the power supply portion 1400 arranged on the printed circuit board PCB to each pixel P. The initialization voltage line VL may include a first initialization voltage line VL1 and a second initialization voltage line VL2. The first initialization voltage line VL1 may overlap the opening area OA in the first direction (e.g., the x direction or the −x direction) or the second direction (e.g., the y direction or the −y direction). The second initialization voltage line VL2 may be apart from the opening area OA in the first direction (e.g., the x direction or the −x direction) or the second direction (e.g., the y direction or the −y direction).

The first initialization voltage line VL1 may include a first horizontal voltage line HVL1 and a second horizontal voltage line HVL2 each extending in the first direction (e.g., the x direction or the −x direction). The first horizontal voltage line HVL1 and the second horizontal voltage line HVL2 may be arranged on opposite sides of the opening area OA, respectively. In an embodiment, the first horizontal voltage line HVL1 may extend in a direction from the first driver 1100 to the opening area OA. In an embodiment, the second horizontal voltage line HVL2 may extend in a direction from the second driver 1200 to the opening area OA. In some embodiments, although not shown, the first initialization voltage line VL1 may include a vertical voltage line extending in the second direction (e.g., the y direction or the −y direction).

Figure 5:
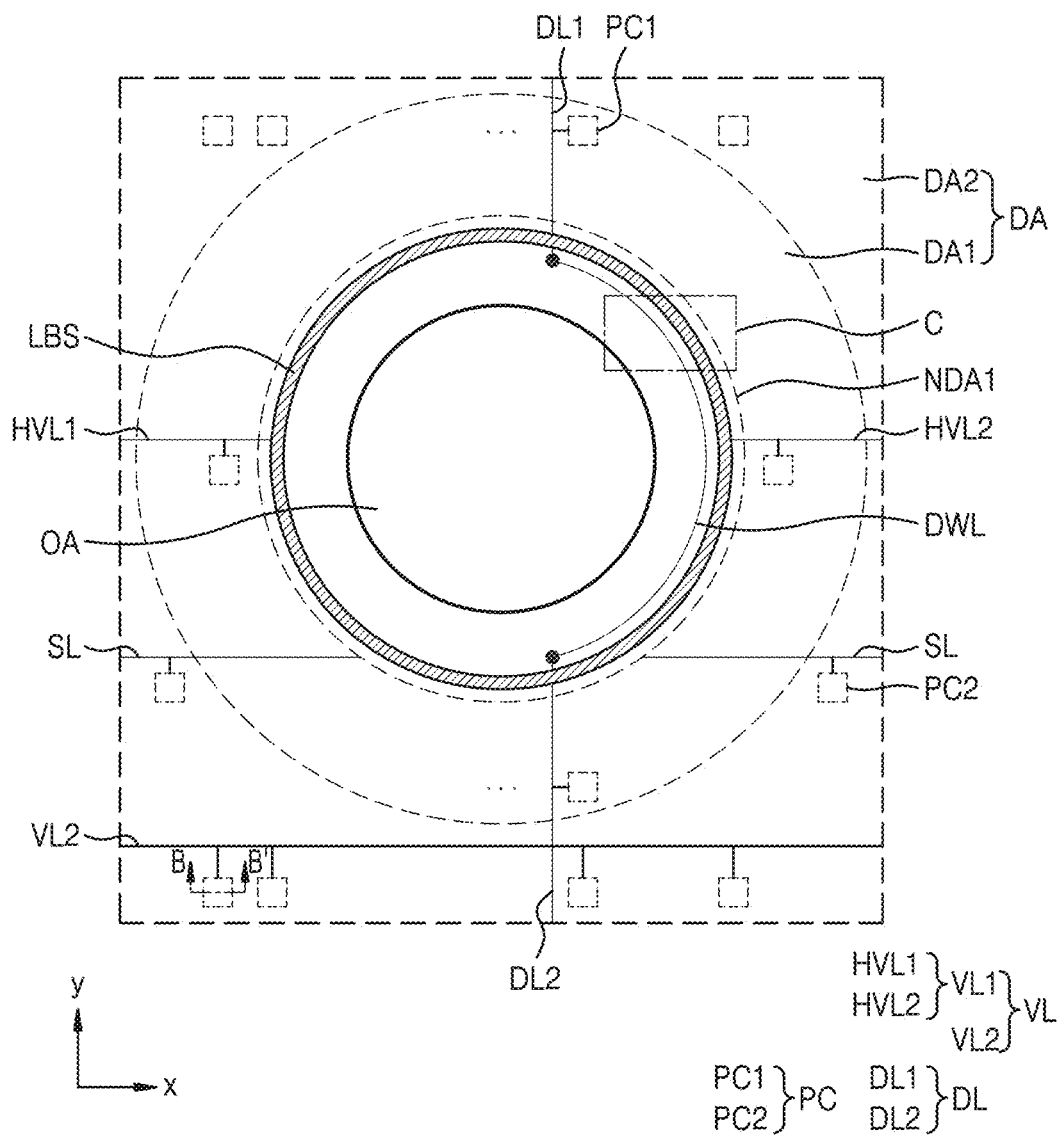
FIG. 5 is a schematic plan view of a portion of a display panel according to an embodiment.

FIG. 5 is a schematic plan view of a portion of a display panel according to an embodiment.

Referring to FIG. 5, a substrate may include an opening area OA, a display area DA, and a first non-display area NDA1. The display area DA may surround the opening area OA. The display area DA may include a first display area DA1 and a second display area DA2. The first display area DA1 may surround the opening area OA. The second display area DA2 may surround the first display area DA1. That is, the first display area DA1 may be a display area arranged closer to the opening area OA than the second display area DA2.

A pixel circuit PC may be arranged on the display area DA. In an embodiment, the pixel circuit PC may include a first thin-film transistor (not shown) and a second thin-film transistor (not shown). The first thin-film transistor may include a first semiconductor layer including a silicon semiconductor. The second thin-film transistor may include a second semiconductor layer including an oxide semiconductor. When the pixel circuit PC includes the first thin-film transistor and the second thin-film transistor, power consumption of the pixel circuit PC may be reduced.

A plurality of pixel circuits PC may be provided in the display area DA. Each of the plurality of pixel circuits PC may be electrically connected to a display element. Although an organic light-emitting diode as a display element is not shown in FIG. 5, each pixel circuit PC may be electrically connected to the display element.

The pixel circuit PC may include a first pixel circuit PC1 and a second pixel circuit PC2. The first pixel circuit PC1 may be arranged in the first display area DA1. The second pixel circuit PC2 may be arranged in the second display area DA2.

A plurality of first pixel circuits PC1 may be spaced apart from each other around the opening area OA. For example, the opening area OA may be arranged between two first pixel circuits PC1 arranged in the first direction (e.g., the x direction or the −x direction) of FIG. 5. Similarly, the opening area OA may be arranged between two first pixel circuits PC1 arranged in the second direction (e.g., the y direction or the −y direction) of FIG. 5.

The pixel circuits PC may be connected to a scan line SL, a data line DL, and an initialization voltage line VL. For example, the pixel circuits PC may be connected to the scan line SL extending in the first direction (e.g., the x direction or the −x direction), and the pixel circuits PC may be connected to the data line DL extending in the second direction (e.g., the y direction or the −y direction). Furthermore, the pixel circuits PC may be connected to the initialization voltage line VL extending in the first direction (e.g., the x direction or the −x direction). The initialization voltage line VL may include a first initialization voltage line VL1 and a second initialization voltage line VL2.

The first initialization voltage line VL1 may overlap the opening area OA in the first direction (e.g., the x direction or the −x direction). The second initialization voltage line VL2 may be apart from the opening area OA in the second direction (e.g., the y direction or the −y direction).

In an embodiment, the data line DL may detour the opening area OA therebetween. That is, the data line DL may include a first data line DL1 and a second data line DL2 spaced apart from each other with the opening area OA therebetween. The first data line DL1 and the second data line DL2 may be connected to each other by a detour line DWL.

The detour line DWL may be arranged in the first non-display area NDA1 and may detour along the edge of the opening area OA. That is, the detour line DWL may surround at least part of the opening area OA.

In an embodiment, the detour line DWL may be arranged on a different layer from the first data line DL1 and/or the second data line DL2, and may be connected to the first data line DL1 and/or the second data line DL2 through a contact hole. In another embodiment, the first data line DL1, the detour line DWL, and the second data line DL2 may be arranged in the same layer. In this case, the first data line DL1, the detour line DWL, and the second data line DL2 may be integrally provided. That is, the first data line DL1, the detour line DWL, and the second data line DL2 may be monolithic.

Two pixel circuits PC arranged in the first direction (e.g., the x direction or the −x direction) with the opening area OA therebetween may be electrically connected to different scan lines SL from each other. Scan lines SL arranged on the left side of the opening area OA may be electrically connected to the first driver 1100 described above with reference to FIG. 4, and scan lines SL arranged on the right side of the opening area OA may be electrically connected to the second driver 1200 described above with reference to FIG. 4. As illustrated in FIG. 4, when the display panel includes two drivers, pixel circuits PC arranged on opposite sides of the opening area OA may be connected to scan lines SL spaced apart from each other, respectively.

In another embodiment, if any one of the first driver 1100 and the second driver 1200 described with reference to FIG. 4 is omitted, two pixel circuits PC extending in the first direction (e.g., the x direction or the −x direction) with the opening area OA therebetween may be electrically connected to the same scan line SL. Like the data line DL, the scan line SL may include a detour scan line extending along the edge of the opening area OA in the first non-display area NDA1.

A light-blocking structure LBS may block external light from traveling from the opening area OA to the display area DA. The light-blocking structure LBS may be defined as a component of the display panel 10. The light-blocking structure LBS may be arranged in the first non-display area NDA1. In an embodiment, the light-blocking structure LBS may partially surround the opening area OA. For example, the light-blocking structure LBS may surround the entire opening area OA. FIG. 5 illustrates that the light-blocking structure LBS continuously surrounds the entire opening area OA. However, in another embodiment, the light-blocking structure LBS may discontinuously surround the opening area OA. For example, the light-blocking structure LBS may include a plurality of light-blocking patterns spaced apart from each other.

In an embodiment, the light-blocking structure LBS may surround at least a portion of the detour line DWL. In this case, the light-blocking structure LBS may be arranged closer to the display area DA than the detour line DWL. In an embodiment, the detour line DWL may surround at least part of the light-blocking structure LBS. In this case, the detour line DWL may be arranged closer to the display area DA than the light-blocking structure LBS. In an embodiment, the light-blocking structure LBS may be provided integrally with the detour line DWL.

The first pixel circuit PC1 arranged adjacent to the opening area OA may be exposed to external light. When the first pixel circuit PC1 is exposed to external light, the reliability of the second thin-film transistor including an oxide semiconductor may be deteriorated. However, because the present embodiment includes the light-blocking structure LBS that surrounds at least part of the opening area OA, the exposure of the first pixel circuit PC1 to external light may be effectively prevented or reduced. Accordingly, the reliability of the second thin-film transistor including the oxide semiconductor may be improved, and the reliability of the display panel may be improved.

Figure 6:
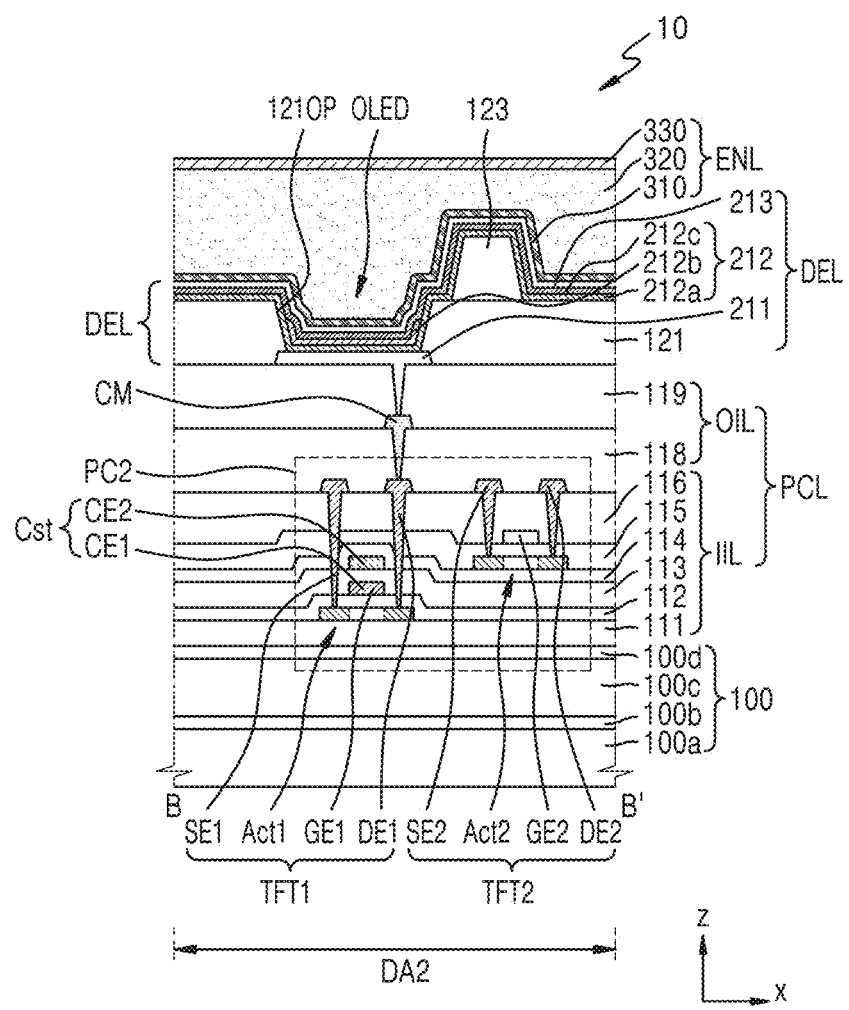
FIG. 6 is a schematic plan view of a display panel according to an embodiment, taken along line B-B' of FIG. 5.

FIG. 6 is a schematic plan view of a display panel 10 according to an embodiment, taken along line B-B' of FIG. 5.

Referring to FIG. 6, the display panel 10 may include a substrate 100, a pixel circuit layer PCL, a display element layer DEL, and an encapsulation layer ENL. The pixel circuit layer PCL, the display element layer DEL, and the encapsulation layer ENL may be sequentially stacked on the substrate 100.

The substrate 100 may include a first base layer 100*a*, a first barrier layer 100*b*, a second base layer 100*c*, and a second barrier layer 100*d*. In an embodiment, the first base layer 100a, the first barrier layer 100b, the second base layer 100c, and the second barrier layer 100d may be sequentially stacked and provided on the substrate 100. In another embodiment, the substrate 100 may include glass.

At least one of the first base layer 100a and the second base layer 100c may include a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate.

The first barrier layer 100b and the second barrier layer 100d may prevent the penetration of foreign materials, and may each have a single layer or multiple layers including an inorganic material such as silicon nitride ($SiN_x$), silicon oxide ($SiO_2$), and/or silicon oxynitride (SiON).

The pixel circuit layer PCL may be arranged on the substrate 100. The pixel circuit layer PCL may include an inorganic insulating layer IIL, an organic insulating layer OIL, a second pixel circuit PC2, and a connection electrode CM. The inorganic insulating layer IIL may include a buffer layer 111, a first gate insulating layer 112, a second gate insulating layer 113, a first insulating layer 114, an intermediate insulating layer 115, and a second insulating layer 116.

The second pixel circuit PC2 may be arranged on a second display area DA2. The second pixel circuit PC2 may include a first thin-film transistor TFT1, a second thin-film transistor TFT2, and a storage capacitor Cst. The first thin-film transistor TFT1 may include a first semiconductor layer Act1, a first gate electrode GE1, a first source electrode SE1, and a first drain electrode DE1. The second thin-film transistor TFT2 may include a second semiconductor layer Act2, a second gate electrode GE2, a second source electrode SE2, and a second drain electrode DE2. The storage capacitor Cst may include a lower electrode CE1 and an upper electrode CE2.

The buffer layer 111 may be arranged on the substrate 100. The buffer layer 111 may include an inorganic insulating material such as $SiN_x$, SiON, and $SiO_2$, and may have a single layer or multiple layers including the inorganic insulating material.

The first semiconductor layer Act1 may include a silicon semiconductor. The first semiconductor layer Act1 may include polysilicon. Alternatively, the first semiconductor layer Act1 may include amorphous silicon. In some embodiments, the first semiconductor layer Act1 may include an oxide semiconductor or an organic semiconductor. The first semiconductor layer Act1 may include a channel region, and a drain region and a source region arranged on opposite sides of the channel region, respectively. The first gate electrode GE1 may overlap the channel region in a plan view.

The first gate electrode GE1 may overlap the first semiconductor layer Act1. The first gate electrode GE1 may include a low resistance metal material. The first gate electrode GE1 may include a conductive material including molybdenum (Mo), aluminum (Al), copper (Cu), titanium (Ti), or the like, and may be a multilayer or single layer including the conductive material.

The first gate insulating layer 112 may be arranged between the first semiconductor layer Act1 and the first gate electrode GE1. Accordingly, the first semiconductor layer Act1 may be insulated from the first gate electrode GE1. The first gate insulating layer 112 may include an inorganic insulating material such as $SiO_2$, $SiN_x$, SiON, aluminum oxide ($Al_2O_3$), titanium oxide ($TiO_2$), tantalum oxide ($Ta_2O_5$), hafnium oxide ($HfO_2$), and/or zinc oxide (ZnO).

The second gate insulating layer 113 may cover the first gate electrode GE1. The second gate insulating layer 113 may be arranged on the first gate electrode GE1. Similar to the first gate insulating layer 112, the second gate insulating layer 113 may include an inorganic insulating material such as $SiO_2$, $SiN_x$, SiON, $Al_2O_3$, $TiO_2$, $Ta_2O_5$, $HfO_2$, and/or ZnO.

The upper electrode CE2 may be arranged on the second gate insulating layer 113. The upper electrode CE2 may overlap the first gate electrode GE1 thereunder in a plan view. In this case, the upper electrode CE2 and the first gate electrode GE1 may overlap each other with the second gate insulating layer 113 therebetween to form the storage capacitor Cst. That is, the first gate electrode GE1 of the first thin-film transistor TFT1 may function as the lower electrode CE1 of the storage capacitor Cst.

In this way, the storage capacitor Cst and the first thin-film transistor TFT1 may be disposed to overlap each other. In some embodiments, the storage capacitor Cst may be disposed so as not to overlap the first thin-film transistor TFT1 in a plan view.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single layer or multiple layers of the aforementioned material.

The first insulating layer 114 may cover the upper electrode CE2. In an embodiment, the first insulating layer 114 may cover the first semiconductor layer Act1. In an embodiment, the first insulating layer 114 may be arranged under the second semiconductor layer Act2. The first insulating layer 114 may include $SiO_2$, $SiN_x$, SiON, $Al_2O_3$, $TiO_2$, $Ta_2O_5$, $HfO_2$, ZnO, or the like. The first insulating layer 114 may have a single layer or multiple layers including the aforementioned inorganic insulating material.

The second semiconductor layer Act2 may be arranged on the first insulating layer 114. In an embodiment, the second semiconductor layer Act2 may include a channel region, and a source region and a drain region arranged on opposite sides of the channel region. The second semiconductor layer Act2 may include an oxide semiconductor. For example, the second semiconductor layer Act2 may include a Zn oxide-based material, and may be formed of or include a Zn oxide, an In—Zn oxide, a Ga—In—Zn oxide, or the like. Alternatively, the second semiconductor layer Act2 may include an In-Ga—Zn-O ("IGZO"), In—Sn—Zn—O ("ITZO"), or In—Ga—Sn—Zn—O ("IGTZO") semiconductor in which metals such as indium (In), gallium (Ga), and/or tin (Sn) are contained in ZnO.

The source region and the drain region of the second semiconductor layer Act2 may be formed by adjusting the carrier concentration of an oxide semiconductor to make the oxide semiconductor conductive. For example, the source region and the drain region of the second semiconductor layer Act2 may be formed by increasing the carrier concentration through plasma treatment using a hydrogen-based gas, a fluorine-based gas, or a combination thereof on the oxide semiconductor.

The intermediate insulating layer 115 may cover the second semiconductor layer Act2. In an embodiment, the intermediate insulating layer 115 may be entirely arranged on the second display area DA2. In another embodiment, the intermediate insulating layer 115 may be patterned according to the shape of the second gate electrode GE2. The intermediate insulating layer 115 may include $SiO_2$, $SiN_x$, SiON, $Al_2O_3$, $TiO_2$, $Ta_2O_5$, $HfO_2$, ZnO, or the like. The intermediate insulating layer 115 may have a single layer or multiple layers including the aforementioned inorganic insulating material.

The second gate electrode GE2 may be arranged on the intermediate insulating layer 115. The second gate electrode GE2 may overlap the second semiconductor layer Act2 in a plan view. The second gate electrode GE2 may overlap the channel region of the second semiconductor layer Act2. The second gate electrode GE2 may include a conductive material including Mo, Al, Cu, Ti, or the like, and may be a multilayer or single layer including the conductive material.

In some embodiments, a third gate electrode overlapping the second semiconductor layer Act2 and arranged under the second semiconductor layer Act2 may be further provided.

The second insulating layer 116 may cover the second gate electrode GE2. The second insulating layer 116 may cover the second semiconductor layer Act2. The second insulating layer 116 may include $SiO_2$, $SiN_X$, SiON, $Al_2O_3$, $TiO_2$, $Ta_2O_5$, $HfO_2$, ZnO, or the like. The second insulating layer 116 may have a single layer or multiple layers including the aforementioned inorganic insulating material.

The first source electrode SE1 and the first drain electrode DE1 may be arranged on the second insulating layer 116. The first source electrode SE1 and the first drain electrode DE1 may be connected to the first semiconductor layer Act1. The first source electrode SE1 and the first drain electrode DE1 may be connected to the first semiconductor layer Act1 through a contact hole of an insulating layer.

The second source electrode SE2 and the second drain electrode DE2 may be arranged on the second insulating layer 116. The second source electrode SE2 and the second drain electrode DE2 may be electrically connected to the second semiconductor layer Act2. The second source electrode SE2 and the second drain electrode DE2 may be electrically connected to the second semiconductor layer Act2 through a contact hole of the intermediate insulating layer 115 and a contact hole of the second insulating layer 116.

The first source electrode SE1, the first drain electrode DE1, the second source electrode SE2, and the second drain electrode DE2 may each include a material having good conductivity. The first source electrode SE1, the first drain electrode DE1, the second source electrode SE2, and the second drain electrode DE2 may each include a conductive material including Mo, Al, Cu, Ti, or the like, and may be a multilayer or single layer including the conductive material. In an embodiment, the first source electrode SE1, the first drain electrode DE1, the second source electrode SE2, and the second drain electrode DE2 may each have a multilayer structure of Ti/Al/Ti.

Because the first thin-film transistor TFT1 including the first semiconductor layer Act1 including a silicon semiconductor has high reliability, the first thin-film transistor TFT1 may be adopted as a driving thin-film transistor to implement the display panel 10 having high quality.

Because the oxide semiconductor has high carrier mobility and low leakage current, a voltage drop may not be large even though a driving time is long. That is, even during low-frequency driving, a color change of an image due to the voltage drop is not large, and thus, low-frequency driving may be performed. Because the oxide semiconductor has an advantage of having a small leakage current as described above, it is possible to prevent leakage current and reduce power consumption by employing an oxide semiconductor in at least one of the thin-film transistors other than the driving thin-film transistor. For example, the second thin-film transistor TFT2 may include a second semiconductor layer Act2 including an oxide semiconductor.

The organic insulating layer OIL may be arranged on the inorganic insulating layer IIL. The organic insulating layer OIL may include a first organic insulating layer 118 and a second organic insulating layer 119. The first organic insulating layer 118 may be arranged to cover the first source electrode SE1, the first drain electrode DE1, the second source electrode SE2, and the second drain electrode DE2. The first organic insulating layer 118 may include an organic material. For example, the first organic insulating layer 118 may include an organic material, such as a general-purpose polymer such as polymethylmethacrylate ("PMMA") or polystyrene ("PS"), a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The connection electrode CM may be arranged on the first organic insulating layer 118. In this case, the connection electrode CM may be connected to the first drain electrode DE1 or the first source electrode SE1 through a contact hole of the first organic insulating layer 118.

The connection electrode CM may include a material having good conductivity. The connection electrode CM may include a conductive material including Mo, Al, Cu, Ti, or the like, and may be a multilayer or single layer including the conductive material. In an embodiment, the connection electrode CM may have a multilayer structure of Ti/Al/Ti.

The second organic insulating layer 119 may be arranged to cover the connection electrode CM. The second organic insulating layer 119 may include an organic material. For example, the second organic insulating layer 119 may include an organic material, such as a general-purpose polymer such as PMMA or PS, a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The display element layer DEL may be arranged on the pixel circuit layer PCL. The display element layer DEL may include an organic light-emitting diode OLED, a pixel-defining layer 121, and a spacer 123. The organic light-emitting diode OLED may include a first electrode 211, an intermediate layer 212, and a second electrode 213. In an embodiment, the first electrode 211 may be a pixel electrode, and the second electrode 213 may be an opposite electrode.

The first electrode 211 may be arranged on the second organic insulating layer 119. The first electrode 211 may be connected to the connection electrode CM through a contact hole of the second organic insulating layer 119. The first electrode 211 may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In another embodiment, the first electrode 211 may include a reflective layer including Ag, Mg, Al, Pt, Pd, Au, Ni, Nd, Ir, Cr, or a compound thereof. In another embodiment, the first electrode 211 may further include a layer formed of or including ITO, IZO, ZnO, or $In_2O_3$ above and/or below the reflective layer described above.

The pixel-defining layer 121 having an opening 121OP exposing a central portion of the first electrode 211 may be arranged on the first electrode 211. The pixel-defining layer 121 may include an organic insulating material and/or an inorganic insulating material. The opening 121OP may define an emission area of light emitted from the organic light-emitting diode OLED. For example, the width of the opening 121OP may correspond to the width of the emission area.

The spacer 123 may be arranged on the pixel-defining layer 121. The spacer 123 may be used to prevent damage to the substrate 100 and/or a multilayer film on the substrate 100 in a method of manufacturing a display device. In a method of manufacturing the display panel 10, a mask sheet may be used. In this case, the mask sheet may enter the inside of the opening 121OP of the pixel-defining layer 121 or be in close contact with the pixel-defining layer 121. The spacer 123 may prevent defects in which the substrate 100 and a portion of the multilayer film are damaged or broken by the mask sheet when a deposition material is deposited on the substrate 100.

The spacer 123 may include an organic material such as polyimide. Alternatively, the spacer 123 may include an inorganic insulating material such as $SiN_X$ or $SiO_2$, or may include an organic insulating material and an inorganic insulating material.

The intermediate layer 212 may be arranged on the pixel-defining layer 121. The intermediate layer 212 may include an emission layer 212b arranged in the opening 121OP of the pixel-defining layer 121. The emission layer 212b may include a polymer or a low molecular weight organic material that emits light of a certain color.

A first functional layer 212a and a second functional layer 212c may be arranged below and above the emission layer 212b. The first functional layer 212a may include, for example, a hole transport layer ("HTL"), or may include an HTL and a hole injection layer ("HIL"). The second functional layer 212c is a component arranged on the emission layer 212b, and may be optional. The second functional layer 212c may include an electron transport layer ("ETL") and/or an electron injection layer ("EIL"). Like the second electrode 213 to be described later, the first functional layer 212a and/or the second functional layer 212c may be a common layer to cover the entire substrate 100.

The second electrode 213 may be made of a conductive material having a low work function. For example, the second electrode 213 may include a (semi) transparent layer including Ag, Mg, Al, Pt, Pd, Au, Ni, Nd, Ir, Cr, Li, Ca, or an alloy thereof. Alternatively, the second electrode 213 may further include a layer including ITO, IZO, ZnO or $In_2O_3$ on the (semi) transparent layer including the aforementioned material.

In some embodiments, a capping layer (not shown) may be further arranged on the second electrode 213. The capping layer may include LiF, an inorganic material, or/and an organic material.

The encapsulation layer ENL may be arranged on the second electrode 213. In an embodiment, the encapsulation layer ENL may include at least one inorganic encapsulation layer and at least one organic encapsulation layer. In an embodiment, FIG. 6 illustrates that the encapsulation layer ENL includes a first inorganic encapsulation layer 310, an organic encapsulation layer 320, and a second inorganic encapsulation layer 330, which are sequentially stacked.

The first inorganic encapsulation layer 310 and/or the second inorganic encapsulation layer 330 may include one or more inorganic materials selected from among $Al_2O_3$, $TiO_2$, $Ta_2O_5$, $HfO_2$, ZnO, $SiO_2$, $SiN_X$, and SiON. The organic encapsulation layer 320 may include a polymer-based material. Examples of polymer-based materials may include acryl-based resin, epoxy-based resin, polyimide and polyethylene. In an embodiment, the organic encapsulation layer 320 may include acrylate.

Figure 7:
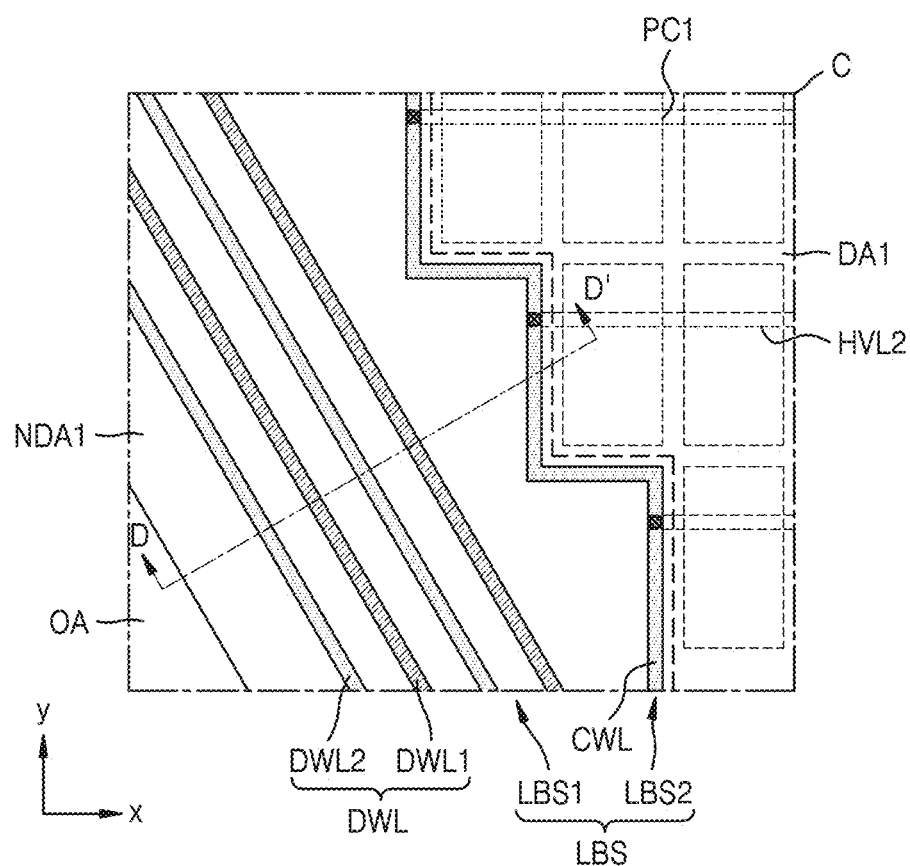
FIG. 7 is a schematic plan view of a portion of a display panel according to an embodiment.

FIG. 7 is a schematic plan view of a portion of a display panel according to an embodiment. FIG. 7 is an enlarged view of a region C of FIG. 5.

Referring to FIG. 7, the display panel 10 may include a substrate, a first pixel circuit PC1, a display element, a detour line DWL, a connection line CWL, and a light-blocking structure LBS. The substrate may include an opening area OA, a first display area DA1, and a first non-display area NDA1.

The first display area DA1 may at least partially surround the opening area OA. In an embodiment, the first display area DA1 may entirely surround the opening area OA. The first pixel circuit PC1 may be arranged in the first display area DA1. Although an organic light-emitting diode as a display element is not shown in FIG. 7, the first pixel circuit PC1 may be electrically connected to the display element. The first pixel circuit PC1 may include a first thin-film transistor and a second thin-film transistor. The first thin-film transistor may include a first semiconductor layer including a silicon semiconductor. The second thin-film transistor may include a second semiconductor layer including an oxide semiconductor. In an embodiment, a plurality of first pixel circuits PC1 may be provided in the first display area DA1.

In an embodiment, a second horizontal voltage line HVL2 may be arranged in the first display area DA1. The second horizontal voltage line HVL2 may be electrically connected to the first pixel circuit PC1. In an embodiment, the second horizontal voltage line HVL2 may transmit an initialization voltage to the first pixel circuit PC1. The second horizontal voltage line HVL2 may extend in a first direction (e.g., an x direction or a −x direction). In an embodiment, a plurality of second horizontal voltage lines HVL2 may be provided and may be apart from each other.

In an embodiment, the second horizontal voltage line HVL2 may extend from the first display area DA1 to the first non-display area NDA1. In this case, the second horizontal voltage line HVL2 may at least partially overlap the first non-display area NDA1 in a plan view.

The first non-display area NDA1 may be arranged between the opening area OA and the first display area DA1. In an embodiment, the detour line DWL, the connection line CWL, and the light-blocking structure LBS may be arranged in the first non-display area NDA1.

The detour line DWL may surround at least part of the opening area OA. That is, the detour line DWL may detour along the edge of the opening area OA. In an embodiment, the detour line DWL may transmit a data signal. In another embodiment, the detour line DWL may transmit a scan signal. The detour line DWL may include a first detour line DWL1 and a second detour line DWL2.

The first detour line DWL1 and the second detour line DWL2 may be alternately arranged in a direction from the first display area DA1 to the opening area OA. In an embodiment, a plurality of first detour lines DWL1 and a plurality of second detour lines DWL2 may be provided. The first detour line DWL1 and the second detour line DWL2 may be arranged on different layers. For example, the first detour line DWL1 may be arranged above one insulating layer. The second detour line DWL2 may be arranged below the one insulating layer. In this case, the distance between the first detour line DWL1 and the second detour line DWL2 may be reduced, and the width of the first non-display area NDA1 may be reduced. That is, the area of the first non-display area NDA1 visually recognized by a user may be reduced.

The connection line CWL may surround at least part of the opening area OA. In an embodiment, the connection line CWL may detour along the edge of the opening area OA. In an embodiment, the connection line CWL may be arranged between the first display area DA1 and the detour line DWL. In an embodiment, the connection line CWL may be bent along the edges of the plurality of first pixel circuits PC1. In another embodiment, the connection line CWL may be arranged in a curved shape similar to the detour line DWL.

In an embodiment, the connection line CWL may transmit the initialization voltage Vint. The connection line CWL may be electrically connected to each of a plurality of adjacent first pixel circuits PC1. In an embodiment, the connection line CWL may be electrically connected to each of the plurality of second horizontal voltage lines HVL2. For example, the connection line CWL may be arranged on a different layer from the plurality of second horizontal voltage lines HVL2, and may be connected to each of the second horizontal voltage lines HVL2 through a contact of an insulating layer arranged between the connection line CWL and the second horizontal voltage line HVL2. Accordingly, the plurality of first pixel circuits PC1 may receive the same initialization voltage Vint.

In an embodiment, the light-blocking structure LBS may be arranged between the opening area OA and the first pixel circuit PC1. When the first pixel circuit PC1 includes the first thin-film transistor and the second thin-film transistor, the first pixel circuit PC1 arranged adjacent to the opening area OA may be exposed to external light. When the first pixel circuit PC1 is exposed to external light, the reliability of the second thin-film transistor including an oxide semiconductor may be deteriorated. However, because the present embodiment includes the light-blocking structure LBS that surrounds at least part of the opening area OA, the exposure of the first pixel circuit PC1 to external light may be effectively prevented or reduced. Accordingly, the reliability of the second thin-film transistor including the oxide semiconductor may be improved, and the reliability of the display panel may be effectively improved.

In an embodiment, the light-blocking structure LBS may include a first light-blocking structure LBS1 and a second light-blocking structure LBS2. The first light-blocking structure LBS1 may include a detour line DWL. In an embodiment, the first light-blocking structure LBS1 may be a detour line DWL. The second light-blocking structure LBS2 may include a connection line CWL. In an embodiment, the second light-blocking structure LBS2 may be a connection line CWL.

Figure 8:
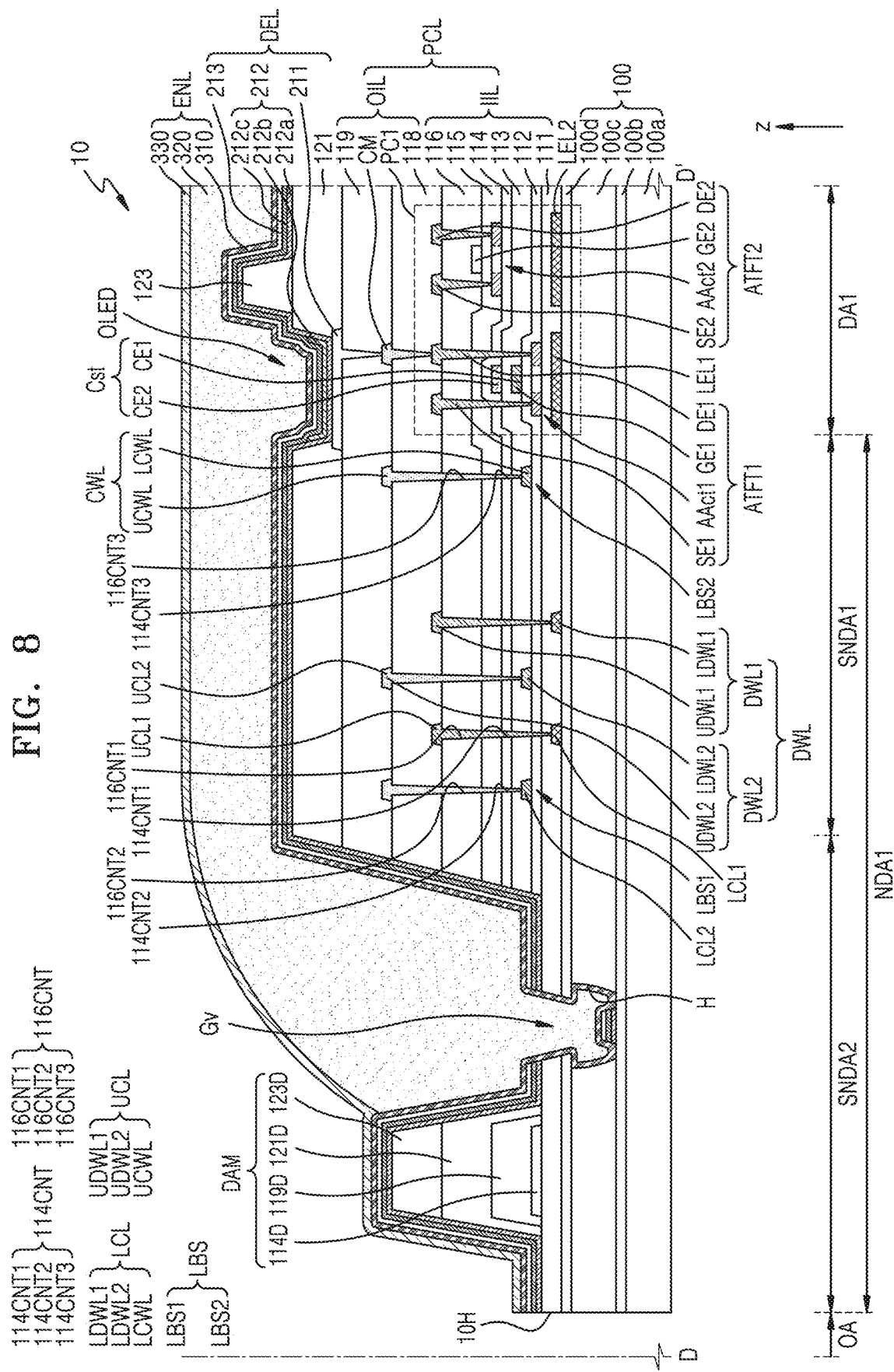
FIG. 8 is a schematic cross-sectional view of the display panel, taken along line D-D' of FIG. 7.

FIG. 8 is a schematic cross-sectional view of the display panel 10, taken along line D-D' of FIG. 7. In FIG. 8, the same reference numerals as those in FIG. 6 denote the same members, and thus, repeated descriptions will be omitted.

Referring to FIG. 8, the display panel 10 may include a substrate 100, a pixel circuit layer PCL, a display element layer DEL, and an encapsulation layer ENL. The pixel circuit layer PCL, the display element layer DEL, and the encapsulation layer ENL may be sequentially stacked on the substrate 100.

The substrate 100 may include an opening area OA, a first display area DA1, and a first non-display area NDA1. In an embodiment, the opening area OA may overlap an opening 10H penetrating the display panel 10 in a plan view. That is, a component of the display panel 10 may not be arranged in the opening area OA. In an embodiment, the first non-display area NDA1 may be arranged between the opening area OA and the first display area DA1. The substrate 100 may include a first base layer 100a, a first barrier layer 100b, a second base layer 100c, and a second barrier layer 100d.

The pixel circuit layer PCL may be arranged on the substrate 100. The pixel circuit layer PCL may include an inorganic insulating layer IIL, an organic insulating layer OIL, a first lower electrode layer LEL1, a second lower electrode layer LEL2, a first pixel circuit PC1, a connection electrode CM, a detour line DWL, and a connection line CWL. The inorganic insulating layer IIL may include a buffer layer 111, a first gate insulating layer 112, a second gate insulating layer 113, a first insulating layer 114, an intermediate insulating layer 115, and a second insulating layer 116.

The first pixel circuit PC1 may be arranged on the first display area DA1. The first pixel circuit PC1 may include a first adjacent thin-film transistor ATFT1 as a first thin-film transistor, a second adjacent thin-film transistor ATFT2 as a second thin-film transistor, and a storage capacitor Cst. The first adjacent thin-film transistor ATFT1 may include a first adjacent semiconductor layer AAct1, a first gate electrode GE1, a first source electrode SE1, and a first drain electrode DE1. The second adjacent thin-film transistor ATFT2 may include a second adjacent semiconductor layer AAct2, a second gate electrode GE2, a second source electrode SE2, and a second drain electrode DE2. The storage capacitor Cst may include a lower electrode CE1 and an upper electrode CE2.

The buffer layer 111 may be arranged on the substrate 100. In an embodiment, the first adjacent semiconductor layer AAct1 may be arranged on the buffer layer 111. The first adjacent semiconductor layer AAct1 may include a silicon semiconductor. The first adjacent semiconductor layer AAct1 may be the same as or similar to the first semiconductor layer Act1 of FIG. 6.

The first gate insulating layer 112 may cover the first adjacent semiconductor layer AAct1, and the first gate electrode GE1 may be arranged on the first gate insulating layer 112. The first gate electrode GE1 may overlap the first adjacent semiconductor layer AAct1 in a plan view.

The second gate insulating layer 113 may cover the first gate electrode GE1. The upper electrode CE2 may be arranged on the second gate insulating layer 113. The upper electrode CE2 may overlap the first gate electrode GE1. In this case, the upper electrode CE2 and the first gate electrode GE1 may overlap each other with the second gate insulating layer 113 therebetween to form the storage capacitor Cst in a plan view.

The first insulating layer 114 may cover the upper electrode CE2. In an embodiment, the first insulating layer 114 may cover the first adjacent semiconductor layer AAct1. The first insulating layer 114 may be arranged under the second adjacent semiconductor layer AAct2. The second adjacent semiconductor layer AAct2 may be arranged on the first insulating layer 114. The second adjacent semiconductor layer AAct2 may include an oxide semiconductor. The second adjacent semiconductor layer AAct2 may be the same as or similar to the second semiconductor layer Act2 of FIG. 6. The intermediate insulating layer 115 may cover the second adjacent semiconductor layer AAct2. The second gate electrode GE2 may be arranged on the intermediate insulating layer 115.

The second insulating layer 116 may cover the second gate electrode GE2. The second insulating layer 116 may cover the second semiconductor layer Act2.

The first source electrode SE1, the first drain electrode DE1, the second source electrode SE2, and the second drain electrode DE2 may be arranged on the second insulating layer 116. The first source electrode SE1 and the first drain electrode DE1 may be connected to the first adjacent semiconductor layer AAct1. The second source electrode SE2 and the second drain electrode DE2 may be electrically connected to the second adjacent semiconductor layer AAct2.

The first adjacent thin-film transistor ATFT1 as described above may be arranged between the opening area OA and the second adjacent thin-film transistor ATFT2. When light is irradiated from the outside, the second adjacent semiconductor layer AAct2 including the oxide semiconductor may be more easily deteriorated than the first adjacent semiconductor layer AAct1 including the silicon semiconductor. When the first adjacent thin-film transistor ATFT1 is arranged between the opening area OA and the second adjacent thin-film transistor ATFT2, the first adjacent thin-film transistor ATFT1 may block light incident from the opening area OA from reaching the second adjacent semiconductor layer AAct2.

The display panel 10 may include a first lower electrode layer LEL1 and a second lower electrode layer LEL2. The first lower electrode layer LEL1 may be arranged under the first adjacent thin-film transistor ATFT1. In an embodiment, the first lower electrode layer LEL1 may be arranged between the substrate 100 and the first adjacent semiconductor layer AAct1. In an embodiment, the first lower electrode layer LEL1 may be arranged between the substrate 100 and the buffer layer 111. The first lower electrode layer LEL1 may effectively prevent or reduce the deterioration of the characteristics of the first adjacent thin-film transistor ATFT1 due to light emitted from a component or the like.

The second lower electrode layer LEL2 may be arranged under the second adjacent thin-film transistor ATFT2. In an embodiment, the second lower electrode layer LEL2 may be arranged between the substrate 100 and the second adjacent semiconductor layer AAct2. In an embodiment, the second lower electrode layer LEL2 may be arranged between the substrate 100 and the buffer layer 111. The second lower electrode layer LEL2 may effectively prevent or reduce the deterioration of the characteristics of the second adjacent thin-film transistor ATFT2 due to light emitted from a component 30 or the like.

In an embodiment, at least one of the first lower electrode layer LEL1 and the second lower electrode layer LEL2 may receive a constant voltage or a signal. When at least one of the first lower electrode layer LEL1 and the second lower electrode layer LEL2 receives a constant voltage or a signal, the probability of occurrence of electrostatic discharge may be significantly reduced.

At least one of the first lower electrode layer LEL1 and the second lower electrode layer LEL2 may include Al, Pt, Pd, Ag, Mg, Au, Ni, Nd, Ir, Cr, Ca, Mo, Ti, W, and/or Cu. At least one of the first lower electrode layer LEL1 and the second lower electrode layer LEL2 may have a single layer or multiple layers of the aforementioned material.

The organic insulating layer OIL may be arranged on the inorganic insulating layer IIL. The organic insulating layer OIL may include a first organic insulating layer 118 and a second organic insulating layer 119. The first organic insulating layer 118 may be arranged on the second insulating layer 116.

The connection electrode CM may be arranged on the first organic insulating layer 118. In this case, the connection electrode CM may be connected to the first drain electrode DE1 or the first source electrode SE1 through a contact hole of the first organic insulating layer 118. The second organic insulating layer 119 may be arranged to cover the connection electrode CM.

The display element layer DEL may be arranged on the pixel circuit layer PCL. The display element layer DEL may include an organic light-emitting diode OLED, a pixel-defining layer 121, and a spacer 123. The organic light-emitting diode OLED may include a first electrode 211, an intermediate layer 212, and a second electrode 213. The intermediate layer 212 may include a first functional layer 212a, an emission layer 212b, and a second functional layer 212c. In some embodiments, at least one of the first functional layer 212a and the second functional layer 212c may be omitted. Hereinafter, a case where the intermediate layer 212 includes both the first functional layer 212a and the second functional layer 212c will be described in detail.

The encapsulation layer ENL may be arranged on the second electrode 213. In an embodiment, the encapsulation layer ENL may include at least one inorganic encapsulation layer and at least one organic encapsulation layer. In an embodiment, FIG. 8 illustrates that the encapsulation layer ENL includes a first inorganic encapsulation layer 310, an organic encapsulation layer 320, and a second inorganic encapsulation layer 330, which are sequentially stacked.

The first non-display area NDA1 may include a first sub-non-display area SNDA1 and a second sub-non-display area SNDA2. The first sub-non-display area SNDA1 may be arranged farther from the opening area OA than the second sub-non-display area SNDA2. The second sub-non-display area SNDA2 may be arranged between the opening area OA and the first sub-non-display area SNDA1.

The inorganic insulating layer IIL and the organic insulating layer OIL may be arranged on the sub-first non-display area SNDA1. The first insulating layer 114 may have a lower contact hole 114CNT overlapping the first non-display area NDA1 in a plan view. In an embodiment, the lower contact hole 114CNT may overlap the first sub-non-display area SNDA1. The second insulating layer 116 may have an upper contact hole 116CNT overlapping the first non-display area NDA1. In an embodiment, the upper contact hole 116CNT may overlap the first sub-non-display area SNDA1. The upper contact hole 116CNT may overlap the lower contact hole 114CNT in a plan view. In this case, the upper contact hole 116CNT may be connected to the lower contact hole 114CNT.

A lower conductive layer LCL may be arranged on the first non-display area NDA1. In an embodiment, the lower conductive layer LCL may be arranged on the first sub-non-display area SNDA1. The lower conductive layer LCL may overlap the lower contact hole 114CNT. In this case, the lower conductive layer LCL may be at least partially exposed by the lower contact hole 114CNT.

In an embodiment, the lower conductive layer LCL may include a first lower detour line LDWL1, a second lower detour line LDWL2, and a lower connection line LCWL. In an embodiment, the lower contact hole 114CNT may include a first lower contact hole 114CNT1, a second lower contact hole 114CNT2, and a third lower contact hole 114CNT3. In this case, the first lower detour line LDWL1, the second lower detour line LDWL2, and the lower connection line LCWL may overlap the first lower contact hole 114CNT1, the second lower contact hole 114CNT2, and the third lower contact hole 114CNT3, respectively, in a plan view.

The lower conductive layer LCL may be arranged between the substrate 100 and the first insulating layer 114. The lower conductive layer LCL may further include at least one of the first lower conductive layer LCL1 and the second lower conductive layer LCL2. In an embodiment, the first lower conductive layer LCL1 may be arranged between the substrate 100 and the buffer layer 111. For example, the first lower detour line LDWL1 as the first lower conductive layer LCL1 may be arranged between the substrate 100 and the buffer layer 111. In this case, the first lower detour line LDWL1 and the first lower electrode layer LEL1 may include the same material.

In an embodiment, the second lower conductive layer LCL2 may be arranged between the first gate insulating layer 112 and the second gate insulating layer 113. For example, as the second lower conductive layer LCL2, the second lower detour line LDWL2 and the lower connection line LCWL may be arranged between the first gate insulating layer 112 and the second gate insulating layer 113. In this case, the second lower conductive layer LCL2 and the first gate electrode GE1 may include the same material.

In another embodiment, the second lower conductive layer LCL2 may be arranged between the second gate insulating layer 113 and the first insulating layer 114. In this case, the second lower conductive layer LCL2 and the upper electrode CE2 may include the same material.

An upper conductive layer UCL may be arranged on the first non-display area NDA1. In an embodiment, the upper conductive layer UCL may be arranged on the first sub-non-display area SNDA1. The upper conductive layer UCL may overlap the lower contact hole 114CNT and the upper contact hole 116CNT in a plan view. The upper conductive layer UCL may be connected to the lower conductive layer LCL through the lower contact hole 114CNT and the upper contact hole 116CNT. Specifically, the lower conductive layer LCL and the upper conductive layer UCL may be connected to each other through contact holes of insulating layers arranged between the lower conductive layer LCL and the upper conductive layer UCL. In an embodiment, the upper conductive layer UCL may be electrically connected to the lower conductive layer LCL through the lower contact hole 114CNT and the upper contact hole 116CNT.

In an embodiment, the upper conductive layer UCL may include a first upper detour line UDWL1, a second upper detour line UDWL2, and an upper connection line UCWL. In an embodiment, the upper contact hole 116CNT may include a first upper contact hole 116CNT1, a second upper contact hole 116CNT2, and a third upper contact hole 116CNT3. The first upper contact hole 116CNT1, the second upper contact hole 116CNT2, and the third upper contact hole 116CNT3 may overlap the first lower contact hole 114CNT1, the second lower contact hole 114CNT2, and the third lower contact hole 114CNT3, respectively, in a plan view.

The upper conductive layer UCL may be arranged on the second insulating layer 116. In an embodiment, the upper conductive layer UCL may include at least one of the first upper conductive layer UCL1 and the second upper conductive layer UCL2. The first upper conductive layer UCL1 may be arranged between the second insulating layer 116 and the first organic insulating layer 118. For example, the first upper detour line UDWL1 as the first upper conductive layer UCL1 may be arranged between the second insulating layer 116 and the first organic insulating layer 118. In this case, the first upper conductive layer UCL1 and the first source electrode SE1 may include the same material.

The second upper conductive layer UCL2 may be arranged between the first organic insulating layer 118 and the second organic insulating layer 119. For example, as the second upper conductive layer UCL2, the second upper detour line UDWL2 and the upper connection line UCWL may be arranged between the first organic insulating layer 118 and the second organic insulating layer 119. In this case, the second upper conductive layer UCL2 and the connection electrode CM may include the same material.

In an embodiment, a plurality of first upper conductive layers UCL1 and a plurality of second upper conductive layers UCL2 may be provided. The plurality of first upper conductive layers UCL1 and the plurality of second upper conductive layers UCL2 may be alternately arranged in a direction from the first display area DA1 to the opening area OA. In this case, the area of the first sub-non-display area SNDA1 may be reduced.

The detour line DWL may be arranged in the first sub-non-display area SNDA1. The detour line DWL may extend to surround at least part of the opening area OA. The detour line DWL may include a first detour line DWL1 and a second detour line DWL2. A plurality of first detour lines DWL1 and a plurality of second detour lines DWL2 may be provided. In this case, the first detour line DWL1 and the second detour line DWL2 may be alternately arranged in a direction from the first display area DA1 to the opening area OA.

In an embodiment, the first lower detour line LDWL1 and the first upper detour line UDWL1 may be included in the first detour line DWL1. In an embodiment, the second lower detour line LDWL2 and the second upper detour line UDWL2 may be included in the second detour line DWL2. In this case, the resistance of the first detour line DWL1 and the resistance of the second detour line DWL2 may be reduced.

The connection line CWL may be arranged in the first sub-non-display area SNDA1. In an embodiment, the connection line CWL may be electrically connected to the first pixel circuit PC1 and may transmit an initialization voltage to the first pixel circuit PC1. The connection line CWL may include a lower connection line LCWL and an upper connection line UCWL. The lower connection line LCWL and the upper connection line UCWL may be connected to each other. In this case, the resistance of the connection line CWL may be reduced.

A light-blocking structure LBS may be arranged in the first non-display area NDA1. The light-blocking structure LBS may include a lower conductive layer LCL, and may include an upper conductive layer UCL connected to the lower conductive layer LCL through a lower contact hole 114CNT and an upper contact hole 116CNT.

When the first pixel circuit PC1 arranged adjacent to the opening area OA is exposed to external light, the reliability of the second adjacent thin-film transistor ATFT2 including an oxide semiconductor may be deteriorated. However, because the present embodiment includes the light-blocking structure LBS that surrounds at least part of the opening area OA, the exposure of the first pixel circuit PC1 to external light in a direction from the opening area OA to the first display area DA1, that is, in a lateral direction, may be effectively prevented or reduced.

The light-blocking structure LBS may include a first light-blocking structure LBS1 and a second light-blocking structure LBS2. The first light-blocking structure LBS1 may include a detour line DWL. In an embodiment, the first light-blocking structure LBS1 may be a detour line DWL. The second light-blocking structure LBS2 may include a connection line CWL. In an embodiment, the second light-blocking structure LBS2 may be a connection line CWL.

A groove Gv and a dam portion DAM may be arranged in the second sub-non-display area SNDA2. In an embodiment, the groove Gv may be defined by a top surface of the first barrier layer 100b, a hole H of the second base layer 100c, and the second barrier layer 100d. In another embodiment, the groove Gv may be defined by a concave portion of the second base layer 100c and the second barrier layer 100d. The concave portion may be defined by a fine shape of the second base layer 100c in a thickness direction (i.e., z direction) of the second base layer 100c. Hereinafter, a detailed description will be given focusing on a case where the groove Gv is defined by the top surface of the first barrier layer 100b, the hole H of the second base layer 100c, and the second barrier layer 100d.

The second barrier layer 100d may have a pair of protruding tips protruding toward the center of the hole H of the second base layer 100c. In an embodiment, the second barrier layer 100d and the buffer layer 111 may have a pair of protruding tips protruding toward the center of the hole H of the second base layer 100c. That is, the groove Gv may have an inverted tapered shape.

In an embodiment, the first gate insulating layer 112, the second gate insulating layer 113, the first insulating layer 114, the intermediate insulating layer 115, the second insulating layer 116, and the organic insulating layer OIL may each have an edge on a side of the second sub-non-display area SNDA2 that faces the opening area OA. In this case, the first functional layer 212a, the second functional layer 212c, and the second electrode 213 may extend from the first display area DA1 along the edge.

The second electrode 213 and at least one of the first functional layer 212a and the second functional layer 212c may be disconnected or separated by the groove Gv. When at least one of the first functional layer 212a and the second functional layer 212c each including an organic material continuously extends from the first non-display area NDA1 to the opening area OA and is exposed in the opening area OA, moisture may penetrate toward the organic light-emitting diode OLED through at least one of the first functional layer 212a and the second functional layer 212c due to the characteristics of the organic material. Here, the organic light-emitting diode OLED is arranged in the first display area DA1. In the present embodiment, because at least one of the first functional layer 212a and the second functional layer 212c is disconnected by the groove Gv, the penetration of moisture or foreign materials into the organic light-emitting diode OLED through at least one of the first functional layer 212a and the second functional layer 212c may be effectively prevented or reduced.

The dam portion DAM may be provided by stacking a plurality of layers. In an embodiment, the dam portion DAM may be provided to protrude from the upper surface of the buffer layer 111. In an embodiment, the dam portion DAM may include an inorganic pattern layer 114D, a first organic pattern layer 119D, a second organic pattern layer 121D, and a third organic pattern layer 123D.

The inorganic pattern layer 114D may be arranged to be separated from the first insulating layer 114. The inorganic pattern layer 114D may include an inorganic material. In an embodiment, the inorganic pattern layer 114D and the first insulating layer 114 may include the same material. In some embodiments, the inorganic pattern layer 114D may be omitted.

The first organic pattern layer 119D may be arranged on the inorganic pattern layer 114D. The first organic pattern layer 119D may be arranged to be separated from the second organic insulating layer 119. The first organic pattern layer 119D may include an organic material. In an embodiment, the first organic pattern layer 119D and the second organic insulating layer 119 may include the same material.

The second organic pattern layer 121D may be arranged on the first organic pattern layer 119D. The second organic pattern layer 121D may be arranged to be separated from the pixel-defining layer 121. The second organic pattern layer 121D may include an organic material. In an embodiment, the second organic pattern layer 121D and the pixel-defining layer 121 may include the same material.

The third organic pattern layer 123D may be arranged on the second organic pattern layer 121D. The third organic pattern layer 123D may be arranged to be separated from the spacer 123. The third organic pattern layer 123D may include an organic material. In an embodiment, the third organic pattern layer 123D and the spacer 123 may include the same material.

The first inorganic encapsulation layer 310 may continuously extend from the first display area DA1 to the opening area OA. The first inorganic encapsulation layer 310 may contact the protruding tip of the second barrier layer 100d.

The organic encapsulation layer 320 may extend from the first display area DA1 to the opening area OA. The organic encapsulation layer 320 may fill the groove Gv. An organic material forming the organic encapsulation layer 320 may be controlled by the dam portion DAM. Accordingly, the organic encapsulation layer 320 may extend from the first display area DA1 to the dam portion DAM. The top surface of the organic encapsulation layer 320 in the first display area DA1 may be flat.

The second inorganic encapsulation layer 330 may continuously extend from the first display area DA1 to the opening area OA. The second inorganic encapsulation layer 330 may contact the first inorganic encapsulation layer 310 in the dam portion DAM.

Figure 9:
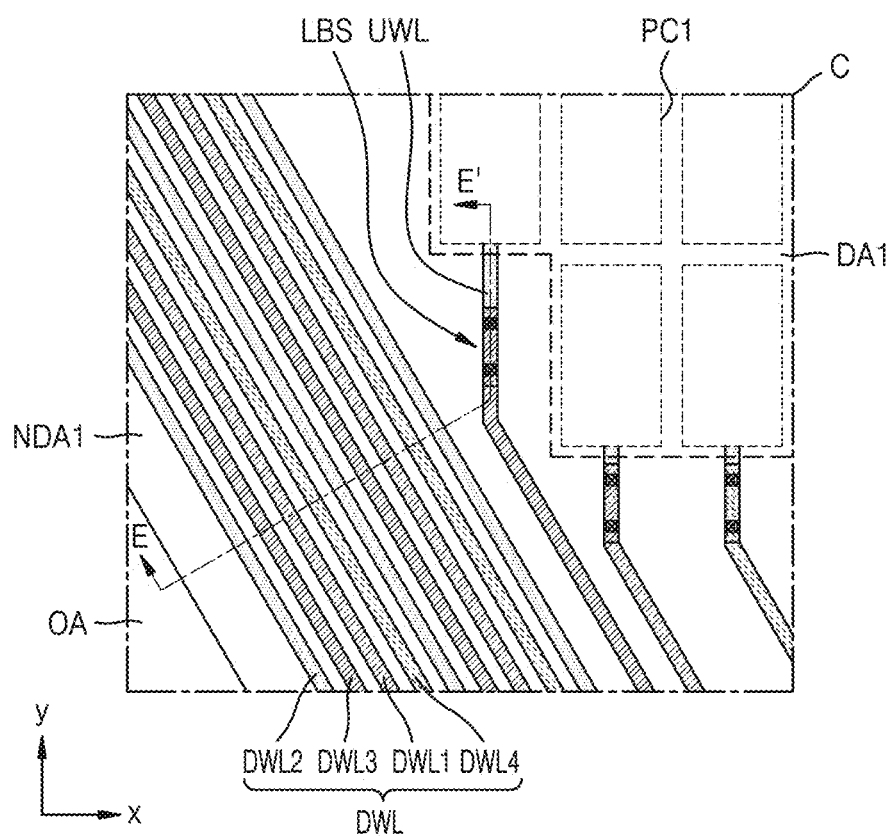
FIG. 9 is a schematic plan view of a portion of a display panel according to another embodiment.

FIG. 9 is a schematic plan view of a portion of a display panel according to another embodiment. FIG. 9 is an enlarged view of a region C of FIG. 5. In FIG. 9, the same reference numerals as those in FIG. 7 denote the same members, and thus, repeated descriptions will be omitted.

Referring to FIG. 9, the display panel may include a substrate, a first pixel circuit PC1, a display element, a detour line DWL, an upper wiring line UWL, and a light-blocking structure LBS. The substrate may include an opening area OA, a first display area DA1, and a first non-display area NDA1.

The first display area DA1 may at least partially surround the opening area OA. In an embodiment, the first display area DA1 may entirely surround the opening area OA. The first pixel circuit PC1 may be arranged in the first display area DA1. Although an organic light-emitting diode as a display element is not shown in FIG. 9, the first pixel circuit PC1 may be electrically connected to the display element.

The first non-display area NDA1 may be arranged between the opening area OA and the first display area DA1. In an embodiment, the detour line DWL and the light-blocking structure LBS may be arranged in the first non-display area NDA1.

The detour line DWL may surround at least part of the opening area OA. The detour line DWL may include a first detour line DWL1, a second detour line DWL2, a third detour line DWL3, and a fourth detour line DWL4.

The first detour line DWL1, the second detour line DWL2, the third detour line DWL3, and the fourth detour line DWL4 may be alternately arranged in a direction from the first display area DA1 to the opening area OA. In an embodiment, a plurality of first detour lines DWL1, a plurality of second detour lines DWL2, a plurality of third detour lines DWL3, and a plurality of fourth detour lines DWL4 may be provided.

The first detour line DWL1, the second detour line DWL2, the third detour line DWL3, and the fourth detour line DWL4 may be arranged on different layers. In this case, an interval between adjacent detour lines DWL may be reduced, and the width of the first non-display area NDA1 may be reduced.

The upper wiring line UWL may be electrically connected to the first pixel circuit PC1. In an embodiment, the upper wiring line UWL may transmit a data signal to the first pixel circuit PC1. In this case, the upper wiring line UWL may be electrically connected to a data line. In another embodiment, the upper wiring line UWL may transmit a scan signal to the first pixel circuit PC1. In this case, the upper wiring line UWL may be electrically connected to a scan line.

The upper wiring line UWL may extend from the first display area DA1 to the first non-display area NDA1. The upper wiring line UWL may extend from the first pixel circuit PC1 to the first non-display area NDA1.

The upper wiring line UWL may be connected to the detour line DWL. The upper wiring line UWL may be electrically connected to the detour line DWL in the first non-display area NDA1.

The light-blocking structure LBS may be arranged between the opening area OA and the first pixel circuit PC1. The light-blocking structure LBS may have a structure connecting the upper wiring line UWL to the detour line DWL. In an embodiment, the upper wiring line UWL and the detour line DWL may be arranged on different layers. For example, the upper wiring line UWL may be arranged above the insulating layer, and the detour line DWL may be arranged below the insulating layer. In this case, the upper wiring line UWL and the detour line DWL may be connected to each other through a contact hole of the insulating layer. A structure including a detour line DWL and an upper wiring line UWL connected to the detour line DWL through a contact hole of the insulating layer may be defined as a light-blocking structure LBS.

A plurality of light-blocking structures LBS may be provided and may be spaced apart from each other. Each of the plurality of light-blocking structures LBS may be arranged to correspond to the first display area DA1. The exposure of the first pixel circuit PC1 to external light may be effectively prevented or reduced. Accordingly, the reliability of the second thin-film transistor including an oxide semiconductor may be improved, and the reliability of the display panel may be improved.

Figure 10:
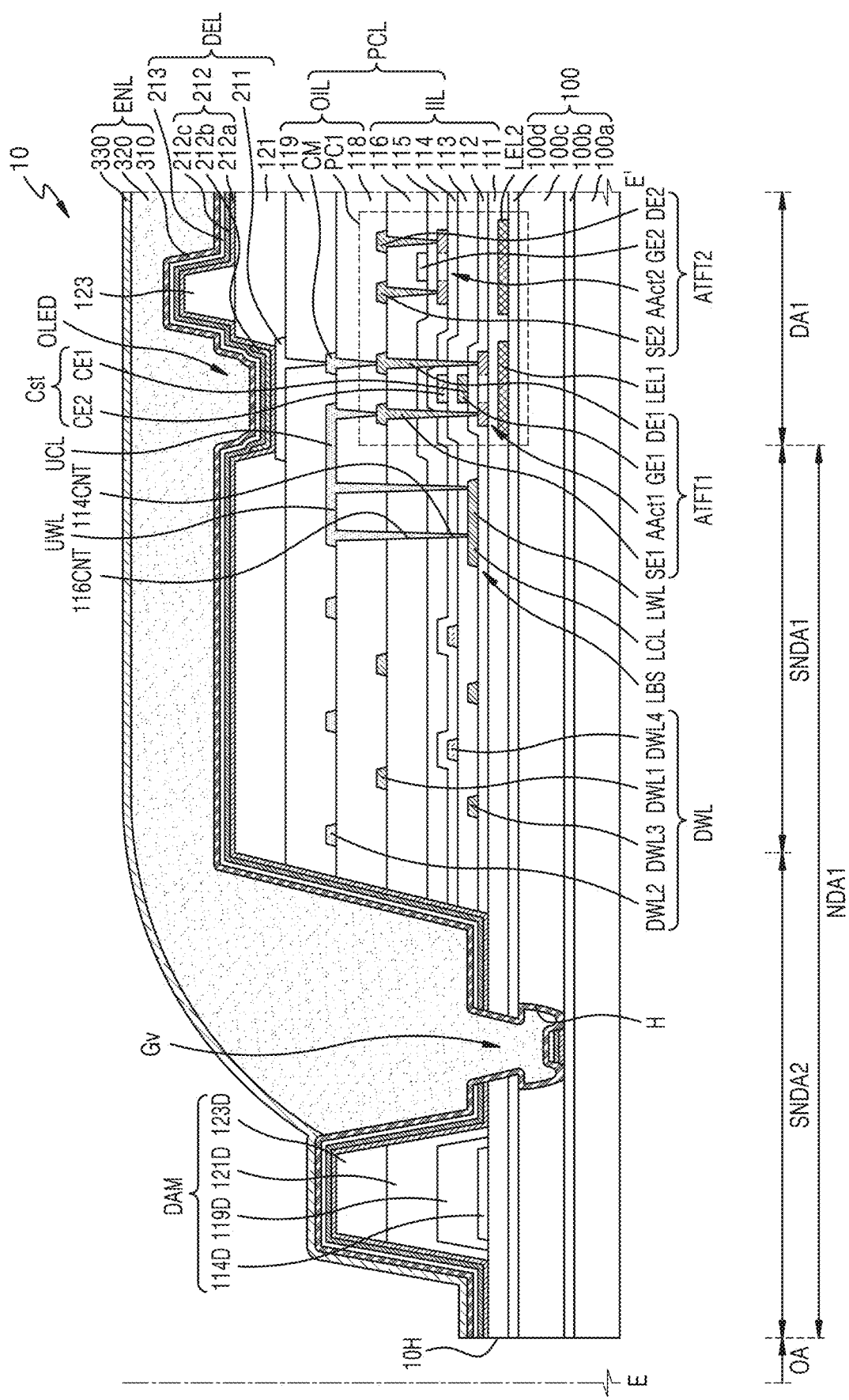
FIG. 10 is a schematic cross-sectional view of the display panel, taken along line E-E' of FIG. 9.

FIG. 10 is a schematic cross-sectional view of the display panel 10 taken along line E-E' of FIG. 9. In FIG. 10, the same reference numerals as those in FIG. 8 denote the same members, and thus, repeated descriptions will be omitted.

Referring to FIG. 10, the display panel 10 may include a substrate 100, a pixel circuit layer PCL, a display element layer DEL, and an encapsulation layer ENL. The pixel circuit layer PCL, the display element layer DEL, and the encapsulation layer ENL may be sequentially stacked on the substrate 100.

The pixel circuit layer PCL may be arranged on the substrate 100. The pixel circuit layer PCL may include an inorganic insulating layer IIL, an organic insulating layer OIL, a first lower electrode layer LEL1, a second lower electrode layer LEL2, a first pixel circuit PC1, a connection electrode CM, a detour line DWL, a lower wiring line LWL, and an upper wiring line UWL. The inorganic insulating layer IIL may include a buffer layer 111, a first gate insulating layer 112, a second gate insulating layer 113, a first insulating layer 114, an intermediate insulating layer 115, and a second insulating layer 116.

The first non-display area NDA1 may include a first sub-non-display area SNDA1 and a second sub-non-display area SNDA2. The first sub-non-display area SNDA1 may be arranged farther from the opening area OA than the second sub-non-display area SNDA2. The second sub-non-display area SNDA2 may be arranged between the opening area OA and the first sub-non-display area SNDA1.

The inorganic insulating layer IIL and the organic insulating layer OIL may be arranged on the first sub-non-display area SNDA1. The first insulating layer 114 may have a lower contact hole 114CNT overlapping the first non-display area NDA1 in a plan view. In an embodiment, the lower contact hole 114CNT may overlap the first sub-non-display area SNDA1. The second insulating layer 116 may have an upper contact hole 116CNT overlapping the first non-display area NDA1. In an embodiment, the upper contact hole 116CNT of the second insulating layer 116 may overlap the first sub-non-display area SNDA1. The upper contact hole 116CNT may overlap the lower contact hole 114CNT in a plan view. In this case, the upper contact hole 116CNT may be connected to the lower contact hole 114CNT.

A lower conductive layer LCL may be arranged on the first non-display area NDA1. In an embodiment, the lower conductive layer LCL may be arranged on the first sub-non-display area SNDA1. The lower conductive layer LCL may overlap the lower contact hole 114CNT in a plan view. In this case, the lower conductive layer LCL may be at least partially exposed by the lower contact hole 114CNT.

In an embodiment, the lower conductive layer LCL may include a lower wiring line LWL. The lower wiring line LWL may extend to surround at least part of the opening area OA. In an embodiment, the lower wiring line LWL may be any one of a plurality of detour lines DWL. The lower wiring line LWL may overlap the lower contact hole 114CNT in a plan view. In an embodiment, a plurality of lower contact holes 114CNT may be provided. Each of the plurality of lower contact holes 114CNT may overlap the lower wiring line LWL.

The lower conductive layer LCL may be arranged between the substrate 100 and the first insulating layer 114. For example, the lower conductive layer LCL may be arranged between the first gate insulating layer 112 and the second gate insulating layer 113. As another example, the lower conductive layer LCL may be arranged between the second gate insulating layer 113 and the first insulating layer 114.

The upper conductive layer UCL may be arranged on the first non-display area NDA1. In an embodiment, the upper conductive layer UCL may be arranged on the first sub-non-display area SNDA1. The upper conductive layer UCL may overlap the lower contact hole 114CNT and the upper contact hole 116CNT in a plan view. The upper conductive layer UCL may be connected to the lower conductive layer LCL through the lower contact hole 114CNT and the upper contact hole 116CNT. Specifically, the lower conductive layer LCL and the upper conductive layer UCL may be connected to each other through contact holes of insulating layers arranged between the lower conductive layer LCL and the upper conductive layer UCL. In an embodiment, the upper conductive layer UCL may be electrically connected to the lower conductive layer LCL through the lower contact hole 114CNT and the upper contact hole 116CNT.

The upper conductive layer UCL may include an upper wiring line UWL. In an embodiment, the upper conductive layer UCL may be an upper wiring line UWL. In an embodiment, the upper wiring line UWL may be electrically connected to the first pixel circuit PC1. For example, the upper wiring line UWL may be electrically connected to any one of the first adjacent thin-film transistor ATFT1 and the second adjacent thin-film transistor ATFT2. In an embodiment, the upper wiring line UWL may transmit a data signal or a scan signal to the first pixel circuit PC1.

The upper wiring line UWL may extend from the first non-display area NDA1 to the first display area DA1. The upper wiring line UWL may overlap the first display area DA1 and the first non-display area NDA1 in a plan view.

The upper conductive layer UCL may be arranged on the second insulating layer 116. In an embodiment, the upper conductive layer UCL may be arranged between the first organic insulating layer 118 and the second organic insulating layer 119. In another embodiment, the upper conductive layer UCL may be arranged between the second insulating layer 116 and the first organic insulating layer 118.

The light-blocking structure LBS may be arranged in the first non-display area NDA1. The light-blocking structure LBS may include a lower conductive layer LCL, and may include an upper conductive layer UCL connected to the lower conductive layer LCL through a lower contact hole 114CNT and an upper contact hole 116CNT.

When the first pixel circuit PC1 arranged adjacent to the opening area OA is exposed to external light, the reliability of the second adjacent thin-film transistor ATFT2 including an oxide semiconductor may be deteriorated. However, because the present embodiment includes the light-blocking structure LBS that surrounds at least part of the opening area OA, the exposure of the first pixel circuit PC1 to external light in a direction from the opening area OA to the first display area DA1, that is, in a lateral direction, may be effectively prevented or reduced.

The detour line DWL may be arranged in the first sub-non-display area SNDA1. The detour line DWL may extend to surround at least part of the opening area OA. The detour line DWL may include a first detour line DWL1, a second detour line DWL2, a third detour line DWL3, and a fourth detour line DWL4.

The first detour line DWL1 may be arranged between the second insulating layer 116 and the first organic insulating layer 118. In an embodiment, the first detour line DWL1 and the first source electrode SE1 may include the same material. The second detour line DWL2 may be arranged between the first organic insulating layer 118 and the second organic insulating layer 119. In an embodiment, the second detour line DWL2 may include the same material as the connection electrode CM. The third detour line DWL3 may be arranged between the first gate insulating layer 112 and the second gate insulating layer 113. In an embodiment, the third detour line DWL3 may include the same material as the first gate electrode GE1. The fourth detour line DWL4 may be arranged between the second gate insulating layer 113 and the first insulating layer 114. In an embodiment, the fourth detour line DWL4 and the upper electrode CE2 may include the same material.

The first detour line DWL1, the second detour line DWL2, the third detour line DWL3, and the fourth detour line DWL4 may be alternately arranged in a direction from the first display area DA1 to the opening area OA.

Figure 11:
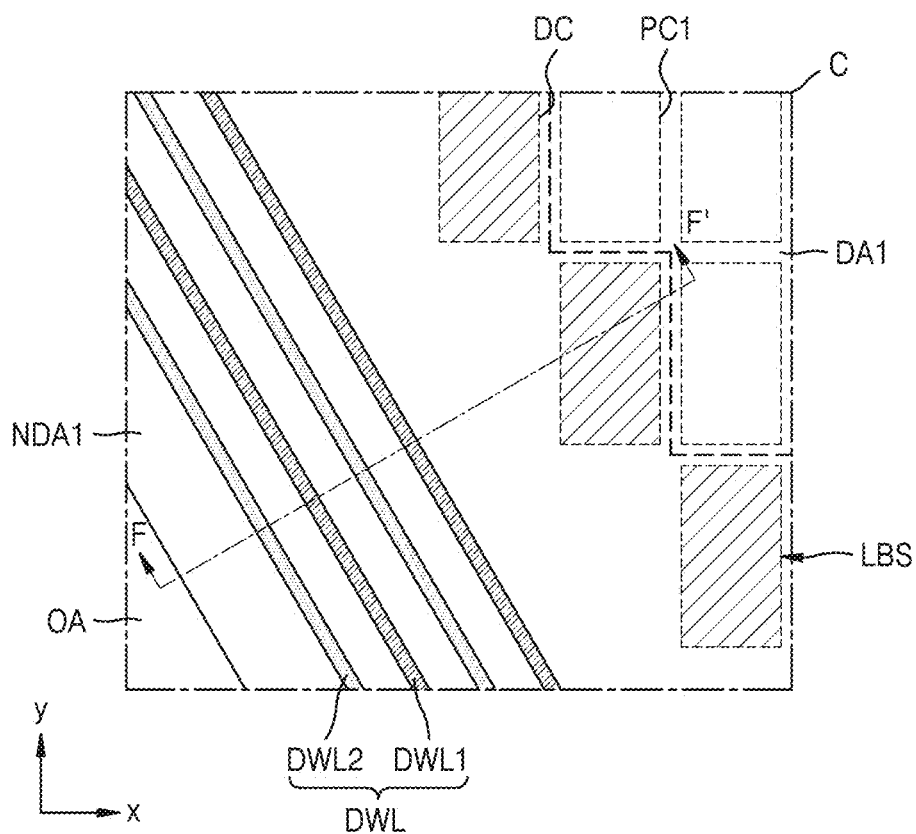
FIG. 11 is a schematic plan view of a portion of a display panel according to still another embodiment.

FIG. 11 is a schematic plan view of a portion of a display panel according to still another embodiment. FIG. 11 is an enlarged view of a region C of FIG. 5. In FIG. 11, the same reference numerals as those in FIG. 7 denote the same members, and thus, repeated descriptions will be omitted.

Referring to FIG. 11, the display panel may include a substrate, a first pixel circuit PC1, a display element, a detour line DWL, and a dummy circuit DC as a light-blocking structure LBS. The substrate may include an opening area OA, a first display area DA1, and a first non-display area NDA1.

The first display area DA1 may surround at least part of the opening area OA. In an embodiment, the first display area DA1 may entirely surround the opening area OA. The first pixel circuit PC1 may be arranged in the first display area DA1. Although an organic light-emitting diode as a display element is not shown in FIG. 11, the first pixel circuit PC1 may be electrically connected to the display element.

The first non-display area NDA1 may be arranged between the opening area OA and the first display area DA1. In an embodiment, the detour line DWL, and the light-blocking structure LBS as a dummy circuit DC may be arranged in the first non-display area NDA1.

The dummy circuit DC may be arranged between the opening area OA and the first pixel circuit PC1. A plurality of dummy circuits DC may be provided, and the plurality of dummy circuits DC may surround at least a portion of the opening area OA. In an embodiment, the plurality of dummy circuits DC may be at least partially surrounded by a plurality of first pixel circuits PC1. The dummy circuit DC may include a dummy thin-film transistor. The dummy thin-film transistor may include a silicon semiconductor that is relatively not vulnerable to external light.

The dummy circuit DC may prevent or reduce the exposure of the first pixel circuit PC1 to external light. Accordingly, the reliability of the second thin-film transistor including an oxide semiconductor may be effectively improved, and the reliability of the display panel may be improved.

Figure 12:
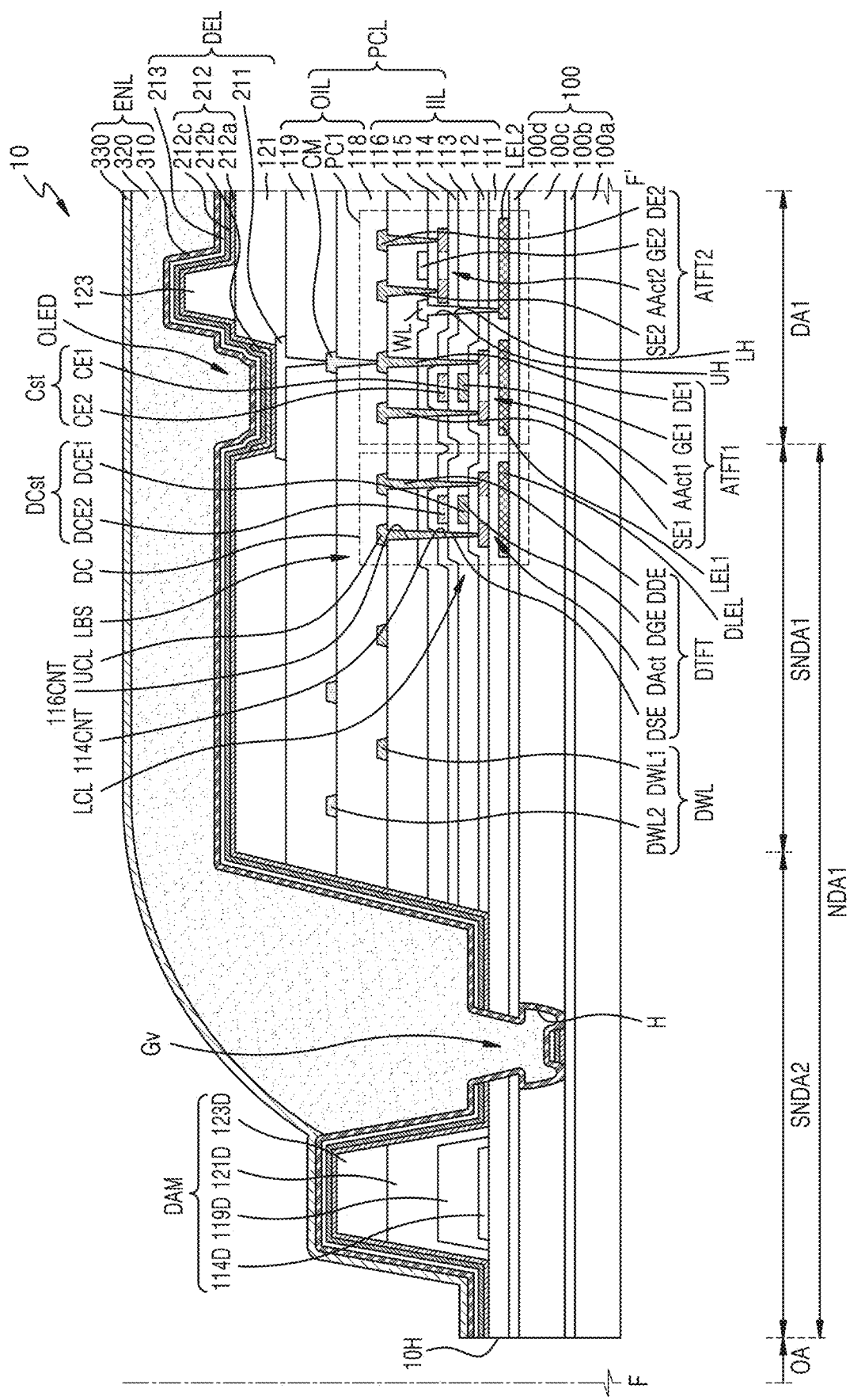
FIG. 12 is a schematic cross-sectional view of the display panel, taken along line F-F' of FIG. 11.

FIG. 12 is a schematic cross-sectional view of the display panel 10 taken along line F-F' of FIG. 11. In FIG. 12, the same reference numerals as those in FIG. 8 denote the same members, and thus, repeated descriptions will be omitted.

Referring to FIG. 12, the display panel 10 may include a substrate 100, a pixel circuit layer PCL, a display element layer DEL, and an encapsulation layer ENL. The pixel circuit layer PCL, the display element layer DEL, and the encapsulation layer ENL may be sequentially stacked on the substrate 100.

The pixel circuit layer PCL may be arranged on the substrate 100. The pixel circuit layer PCL may include an inorganic insulating layer IIL, an organic insulating layer OIL, a first lower electrode layer LEL1, a second lower electrode layer LEL2, a first pixel circuit PC1, a wiring line WL, a detour line DWL, a dummy circuit DC, and a connection electrode CM. The inorganic insulating layer IIL may include a buffer layer 111, a first gate insulating layer 112, a second gate insulating layer 113, a first insulating layer 114, an intermediate insulating layer 115, and a second insulating layer 116.

The first pixel circuit PC1 may be arranged on the first display area DA1. The first pixel circuit PC1 may include a first adjacent thin-film transistor ATFT1 as a first thin-film transistor, a second adjacent thin-film transistor ATFT2 as a second thin-film transistor, and a storage capacitor Cst.

The first adjacent thin-film transistor ATFT1 may be arranged between the opening area OA and the second adjacent thin-film transistor ATFT2. When the first adjacent thin-film transistor ATFT1 is arranged between the opening area OA and the second adjacent thin-film transistor ATFT2, the first adjacent thin-film transistor ATFT1 may block light incident from the opening area OA from reaching the second adjacent semiconductor layer AAct2.

The first lower electrode layer LEL1 may be arranged under the first adjacent thin-film transistor ATFT1. The second lower electrode layer LEL2 may be arranged under the second adjacent thin-film transistor ATFT2.

The wiring line WL may be arranged on the first display area DA1. In an embodiment, the wiring line WL may be arranged between the intermediate insulating layer 115 and the second insulating layer 116. In an embodiment, the wiring line WL and the second gate electrode GE2 may include the same material.

The wiring line WL may be connected to the second lower electrode layer LEL2. The wiring line WL may be connected to the second lower electrode layer LEL2 through holes in an insulating layer arranged between the second lower electrode layer LEL2 and the wiring line WL. For example, the wiring line WL may be connected to the second lower electrode layer LEL2 through a hole of the buffer layer 111, a hole of the first gate insulating layer 112, a hole of the second gate insulating layer 113, a hole LH of the first insulating layer 114, and a hole UH of the intermediate insulating layer 115.

In an embodiment, the hole LH of the first insulating layer 114 and the hole UH of the intermediate insulating layer 115 may be arranged between the opening area OA and the second adjacent semiconductor layer AAct2. Accordingly, the exposure of the second adjacent semiconductor layer AAct2 to external light in a direction from the opening area OA to the first display area DA1, that is, in a lateral direction, may be effectively prevented or reduced.

The first non-display area NDA1 may include a first sub-non-display area SNDA1 and a second sub-non-display area SNDA2. The first sub-non-display area SNDA1 may be arranged farther from the opening area OA than the second sub-non-display area SNDA2. The second sub-non-display area SNDA2 may be arranged between the opening area OA and the first sub-non-display area SNDA1.

The inorganic insulating layer IIL and the organic insulating layer OIL may be arranged on the first sub-non-display area SNDA1. The first insulating layer 114 may have a lower contact hole 114CNT overlapping the first non-display area NDA1 in a plan view. In an embodiment, the lower contact hole 114CNT may overlap the first sub-non-display area SNDA1. The second insulating layer 116 may have an upper contact hole 116CNT overlapping the first non-display area NDA1. In an embodiment, the upper contact hole 116CNT of the second insulating layer 116 may overlap the first sub-non-display area SNDA1. The upper contact hole 116CNT may overlap the lower contact hole 114CNT in a plan view. In this case, the upper contact hole 116CNT may be connected to the lower contact hole 114CNT.

The dummy circuit DC may be arranged in the first sub-non-display area SDNA1. The dummy circuit DC may include a dummy thin-film transistor DTFT. In an embodiment, the dummy circuit DC may further include a dummy storage capacitor DCst. The dummy thin-film transistor DTFT may include a dummy semiconductor layer DAct, a dummy gate electrode DGE, a dummy source electrode SDE, and a dummy drain electrode DDE. The dummy semiconductor layer DAct may include a silicon semiconductor. Accordingly, the dummy semiconductor layer DAct may not be more vulnerable to external light than the second adjacent semiconductor layer AAct2 including an oxide semiconductor. The dummy semiconductor layer DAct, the dummy gate electrode DGE, the dummy source electrode SDE, and the dummy drain electrode DDE are the same as or similar to the first adjacent semiconductor layer AAct1, the first gate electrode GE1, the first source electrode SE1, and the first drain electrode DE1, respectively, and thus, detailed descriptions will be omitted.

The dummy storage capacitor DCst may include a dummy lower electrode DCE1 and a dummy upper electrode DCE2. Because the dummy lower electrode DCE1 and the dummy upper electrode DCE2 are the same as or similar to the lower electrode CE1 and the upper electrode CE2, respectively, detailed descriptions will be omitted.

The display panel 10 may include a dummy lower electrode layer DLEL arranged under the dummy thin-film transistor DTFT. In an embodiment, the dummy lower electrode layer DLEL may be arranged between the substrate 100 and the dummy semiconductor layer DAct. In an embodiment, the dummy lower electrode layer DLEL may be arranged between the substrate 100 and the buffer layer 111. The dummy lower electrode layer DLEL may effectively prevent or reduce the deterioration of the characteristics of the dummy thin-film transistor DTFT due to light emitted from a component or the like.

In an embodiment, the dummy lower electrode layer DLEL may receive a constant voltage or a signal. When the dummy lower electrode layer DLEL receives a constant voltage or a signal, the probability of occurrence of electrostatic discharge may be significantly reduced.

A lower conductive layer LCL may be arranged on the first non-display area NDA1. In an embodiment, the lower conductive layer LCL may be arranged on the first sub-non-display area SNDA1. The lower conductive layer LCL may overlap the lower contact hole 114CNT in a plan view. In this case, the lower conductive layer LCL may be at least partially exposed by the lower contact hole 114CNT.

In an embodiment, the lower conductive layer LCL may include a dummy semiconductor layer DAct. The dummy semiconductor layer DAct may be partially exposed by the lower contact hole 114CNT.

The lower conductive layer LCL may be arranged between the substrate 100 and the first insulating layer 114. In an embodiment, the dummy semiconductor layer DAct may be arranged between the buffer layer 111 and the first gate insulating layer 112.

The upper conductive layer UCL may be arranged on the first non-display area NDA1. In an embodiment, the upper conductive layer UCL may be arranged on the first sub-non-display area SNDA1. The upper conductive layer UCL may overlap the lower contact hole 114CNT and the upper contact hole 116CNT in a plan view. The upper conductive layer UCL may be connected to the lower conductive layer LCL through the lower contact hole 114CNT and the upper contact hole 116CNT. Specifically, the lower conductive layer LCL and the upper conductive layer UCL may be connected to each other through contact holes of insulating layers arranged between the lower conductive layer LCL and the upper conductive layer UCL. In an embodiment, the upper conductive layer UCL may be electrically connected to the lower conductive layer LCL through the lower contact hole 114CNT and the upper contact hole 116CNT.

In an embodiment, the upper conductive layer UCL may include at least one of a dummy source electrode DSE and a dummy drain electrode DDE. At least one of the dummy source electrode DSE and the dummy drain electrode DDE may overlap the lower contact hole 114CNT and the upper contact hole 116CNT in a plan view.

The upper conductive layer UCL may be arranged on the second insulating layer 116. In an embodiment, at least one of the dummy source electrode DSE and the dummy drain electrode DDE may be arranged between the second insulating layer 116 and the first organic insulating layer 118.

The light-blocking structure LBS may be arranged in the first non-display area NDA1. The light-blocking structure LBS may include a lower conductive layer LCL, and may include an upper conductive layer UCL connected to the lower conductive layer LCL through the lower contact hole 114CNT and the upper contact hole 116CNT.

In an embodiment, the light-blocking structure LBS may include a dummy circuit DC. In an embodiment, the light-blocking structure LBS may be a dummy circuit DC.

Because the present embodiment includes the light-blocking structure LBS that surrounds at least part of the opening area OA, the exposure of the first pixel circuit PC1 to external light in a direction from the opening area OA to the first display area DA1, that is, in a lateral direction, may be effectively prevented or reduced.

The detour line DWL may be arranged in the first sub-non-display area SNDA1. The detour line DWL may extend to surround at least part of the opening area OA. The detour line DWL may include a first detour line DWL1 and a second detour line DWL2. A plurality of first detour lines DWL1 and a plurality of second detour lines DWL2 may be provided. In this case, the first detour line DWL1 and the second detour line DWL2 may be alternately arranged in a direction from the first display area DA1 to the opening area OA.

Figure 13A:
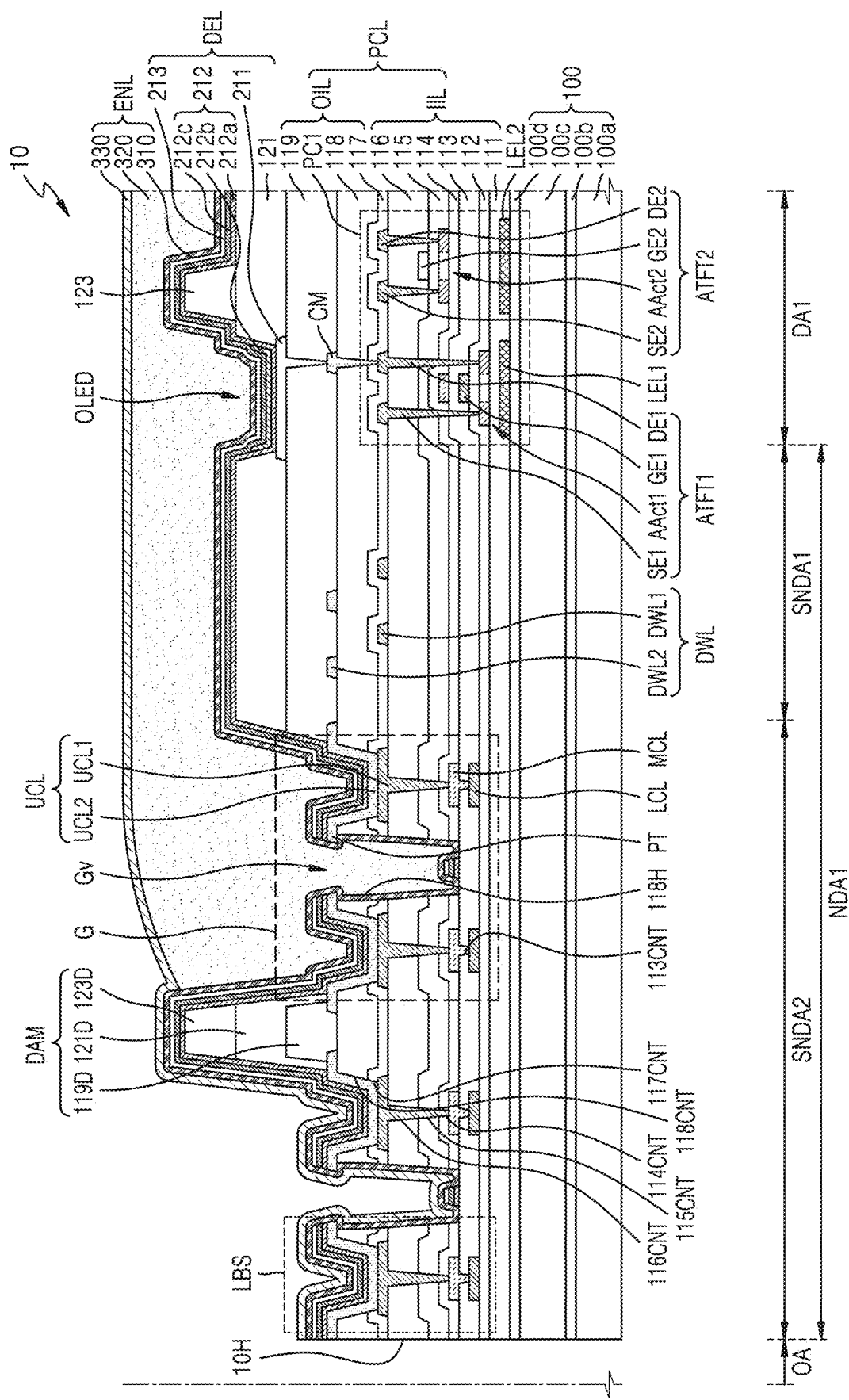
FIG. 13A is a schematic cross-sectional view of a display panel according to another embodiment.
Figure 13B:
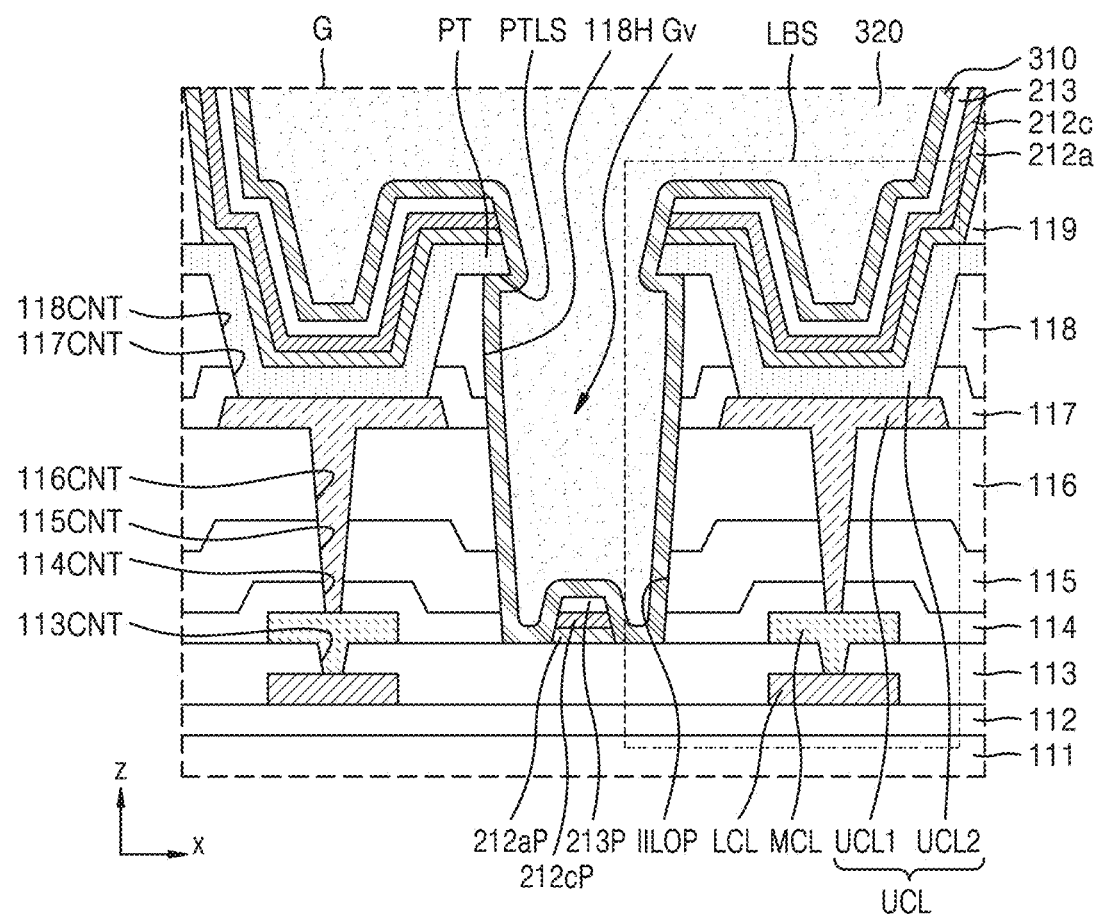
FIG. 13B is an enlarged view of a portion G of FIG. 13A.

FIG. 13A is a schematic cross-sectional view of a display panel 10 according to another embodiment. FIG. 13B is an enlarged view of a portion G of FIG. 13A. In FIGS. 13A and 13B, the same reference numerals as those in FIG. 8 denote the same members, and thus, repeated descriptions will be omitted.

Referring to FIGS. 13A and 13B, the display panel 10 may include a substrate 100, a pixel circuit layer PCL, a display element layer DEL, and an encapsulation layer ENL. The pixel circuit layer PCL, the display element layer DEL, and the encapsulation layer ENL may be sequentially stacked on the substrate 100.

The substrate 100 may include an opening area OA, a first display area DA1, and a first non-display area NDA1. In an embodiment, the first non-display area NDA1 may be arranged between the opening area OA and the first display area DA1.

The pixel circuit layer PCL may be arranged on the substrate 100. The pixel circuit layer PCL may include an inorganic insulating layer IIL, an organic insulating layer OIL, a first lower electrode layer LEL1, a second lower electrode layer LEL2, a first pixel circuit PC1, a connection electrode CM, and a detour line DWL. The inorganic insulating layer IIL may include a buffer layer 111, a first gate insulating layer 112, a second gate insulating layer 113, a first insulating layer 114, an intermediate insulating layer 115, a second insulating layer 116, and an inorganic layer 117.

The inorganic layer 117 may be arranged between the second insulating layer 116 and the first organic insulating layer 118. The inorganic layer 117 may cover a first source electrode SE1, a first drain electrode DE1, a second source electrode SE2, and a second drain electrode DE2. In addition, the inorganic layer 117 may cover a first detour line DWL1 and a first upper conductive layer UCL1. The inorganic layer 117 may include an inorganic insulating material such as $SiO_2$, $SiN_x$, $SiON$, $Al_2O_3$, $TiO_2$, $Ta_2O_5$, $HfO_2$, and/or $ZnO$. In some embodiments, the inorganic layer 117 may be omitted.

The first non-display area NDA1 may include a first sub-non-display area SNDA1 and a second sub-non-display area SNDA2. The first sub-non-display area SNDA1 may be arranged farther from the opening area OA than the second sub-non-display area SNDA2. The second sub-non-display area SNDA2 may be arranged between the opening area OA and the first sub-non-display area SNDA1.

The detour line DWL may be arranged in the first sub-non-display area SNDA1. The detour line DWL may extend to surround at least part of the opening area OA. The detour line DWL may include a first detour line DWL1 and a second detour line DWL2. A plurality of first detour lines DWL1 and a plurality of second detour lines DWL2 may be provided. In this case, the first detour line DWL1 and the second detour line DWL2 may be alternately arranged in a direction from the first display area DA1 to the opening area OA.

The inorganic insulating layer IIL and the first organic insulating layer 118 may be arranged on the second sub-non-display area SNDA2. The first insulating layer 114 may have a lower contact hole 114CNT overlapping the first non-display area NDA1 in a plan view. In an embodiment, the lower contact hole 114CNT may overlap the second sub-non-display area SNDA2. The second insulating layer 116 may have an upper contact hole 116CNT overlapping the first non-display area NDA1. In an embodiment, the upper contact hole 116CNT may overlap the second sub-non-display area SNDA2. In this case, the upper contact hole 116CNT may be connected to the lower contact hole 114CNT in a plan view.

A lower conductive layer LCL may be arranged on the first non-display area NDA1. In an embodiment, the lower conductive layer LCL may be arranged on the second sub-non-display area SNDA2. The lower conductive layer LCL may overlap the lower contact hole 114CNT in a plan view. In this case, the lower conductive layer LCL may be at least partially exposed by the lower contact hole 114CNT.

The lower conductive layer LCL may be arranged between the substrate 100 and the first insulating layer 114. In an embodiment, the lower conductive layer LCL may be arranged between the first gate insulating layer 112 and the second gate insulating layer 113. The lower conductive layer LCL and the first gate electrode GE1 may include the same material.

In an embodiment, an intermediate conductive layer MCL may be arranged between the second gate insulating layer 113 and the first insulating layer 114. The intermediate conductive layer MCL may be connected to the lower conductive layer LCL through a contact hole 113CNT of the second gate insulating layer 113. The intermediate conductive layer MCL and the upper electrode CE2 may include the same material. In some embodiments, the intermediate conductive layer MCL may be omitted.

The upper conductive layer UCL may be arranged on the first non-display area NDA1. In an embodiment, the upper conductive layer UCL may be arranged on the second sub-non-display area SNDA2. The upper conductive layer UCL may overlap the lower contact hole 114CNT and the upper contact hole 116CNT in a plan view. The upper conductive layer UCL may be connected to the intermediate conductive layer MCL through the lower contact hole 114CNT and the upper contact hole 116CNT. Specifically, the intermediate conductive layer MCL and the upper conductive layer UCL may be connected to each other through the lower contact hole 114CNT, a contact hole 115CNT of the intermediate insulating layer 115, and the upper contact hole 116CNT. In an embodiment, the upper conductive layer UCL may be electrically connected to the intermediate conductive layer MCL.

The upper conductive layer UCL may be arranged on the second insulating layer 116. In an embodiment, the upper conductive layer UCL may include at least one of the first upper conductive layer UCL1 and the second upper conductive layer UCL2. The first upper conductive layer UCL1 may be arranged between the second insulating layer 116 and the first organic insulating layer 118. For example, the first upper conductive layer UCL1 may be arranged between the second insulating layer 116 and the inorganic layer 117. In some embodiments, the first upper conductive layer UCL1 may be omitted.

The second upper conductive layer UCL2 may be arranged between the first organic insulating layer 118 and the second organic insulating layer 119. The second upper conductive layer UCL2 may be connected to the first upper conductive layer UCL1 through a contact hole 117CNT of the inorganic layer 117 and a contact hole 118CNT of the first organic insulating layer 118.

A plurality of second upper conductive layers UCL2 may be provided. In an embodiment, the first insulating layer 114, the intermediate insulating layer 115, the second insulating layer 116, and the inorganic layer 117 may have an inorganic insulating layer opening IILOP between a plurality of adjacent second upper conductive layers UCL2. FIGS. 13A and 13B illustrate that the buffer layer 111, the first gate insulating layer 112, and the second gate insulating layer 113 overlap the inorganic insulating layer opening IILOP and are continuously arranged in a plan view. However, in another embodiment, at least one of the buffer layer 111, the first gate insulating layer 112, and the second gate insulating layer 113 may define an opening overlapping the inorganic insulating layer opening IILOP.

The first organic insulating layer 118 may define a hole 118H between adjacent second upper conductive layers UCL2 from among the plurality of second upper conductive layers UCL2. In an embodiment, a plurality of holes 118H of the first organic insulating layer 118 may be provided in the second sub-non-display area SNDA2.

The plurality of adjacent second upper conductive layers UCL2 may have a pair of protruding tips PT protruding toward the center of the hole 118H of the first organic insulating layer 118. In this case, a lower surface PTLS of the pair of protruding tips PT may overlap the hole 118H of the first organic insulating layer 118 in a plan view. That is, the lower surface PTLS of the protruding tips PT may be exposed through the hole 118H of the first organic insulating layer 118.

The upper surface of the second gate insulating layer 113, the inorganic insulating layer opening IILOP, the hole 118H of the first organic insulating layer 118, and the protruding tips PT of the second upper conductive layer UCL2 may define a groove Gv. That is, the groove Gv may have an inverted tapered shape. In an embodiment, when the display panel 10 includes the inorganic layer 117, the depth of the groove Gv may be further increased.

The second electrode 213 and at least one of the first functional layer 212a and the second functional layer 212c may be disconnected or separated by the groove Gv. In an embodiment, a first functional layer pattern 212aP, a second functional layer pattern 212cP, and a second electrode pattern 213P may be arranged in the groove Gv. The first functional layer pattern 212aP and the first functional layer 212a may include the same material. The second functional layer pattern 212cP and the second functional layer 212c may include the same material. The second electrode pattern 213P and the second electrode 213 may include the same material.

In the present embodiment, because at least one of the first functional layer 212a and the second functional layer 212c is disconnected by the groove Gv, the penetration of moisture or foreign materials into the organic light-emitting diode OLED through at least one of the first functional layer 212a and the second functional layer 212c may be effectively prevented or reduced.

The dam portion DAM may be provided by stacking a plurality of layers. In an embodiment, the dam portion DAM may be provided to protrude from the upper surface of the first organic insulating layer 118. In an embodiment, the dam portion DAM may include a first organic pattern layer 119D, a second organic pattern layer 121D, and a third organic pattern layer 123D.

The first inorganic encapsulation layer 310 may continuously extend from the first display area DA1 to the opening area OA. The first inorganic encapsulation layer 310 may contact the protruding tip PT of the second upper conductive layer UCL2. In an embodiment, the first inorganic encapsulation layer 310 may contact the lower surface PTLS of the protruding tip PT.

The organic encapsulation layer 320 may extend from the first display area DA1 to the opening area OA. The organic encapsulation layer 320 may fill the groove Gv. An organic material forming the organic encapsulation layer 320 may be controlled by the dam portion DAM. Accordingly, the organic encapsulation layer 320 may extend from the first display area DA1 to the dam portion DAM. The top surface of the organic encapsulation layer 320 in the first display area DA1 may be flat.

The second inorganic encapsulation layer 330 may continuously extend from the first display area DA1 to the opening area OA. The second inorganic encapsulation layer 330 may contact the first inorganic encapsulation layer 310 in the dam portion DAM.

The light-blocking structure LBS may be arranged in the first non-display area NDA1. The light-blocking structure LBS may include a lower conductive layer LCL, an intermediate conductive layer MCL, and an upper conductive layer UCL. The intermediate conductive layer MCL may be connected to the lower conductive layer LCL through the contact hole 113CNT of the second gate insulating layer 113, and the upper conductive layer UCL may be connected to the intermediate conductive layer MCL through the lower contact hole 114CNT, the contact hole 115CNT of the intermediate insulating layer 115, and the upper contact hole 116CNT. In the present embodiment, a plurality of light-blocking structures LBS may be provided in the second sub-non-display area SNDA2. Because the present embodiment of the disclosure includes the light-blocking structure LBS that surrounds at least part of the opening area OA, the exposure of the first pixel circuit PC1 to external light in a direction from the opening area OA to the first display area DA1, that is, in a lateral direction, may be effectively prevented or reduced.

Figure 14:
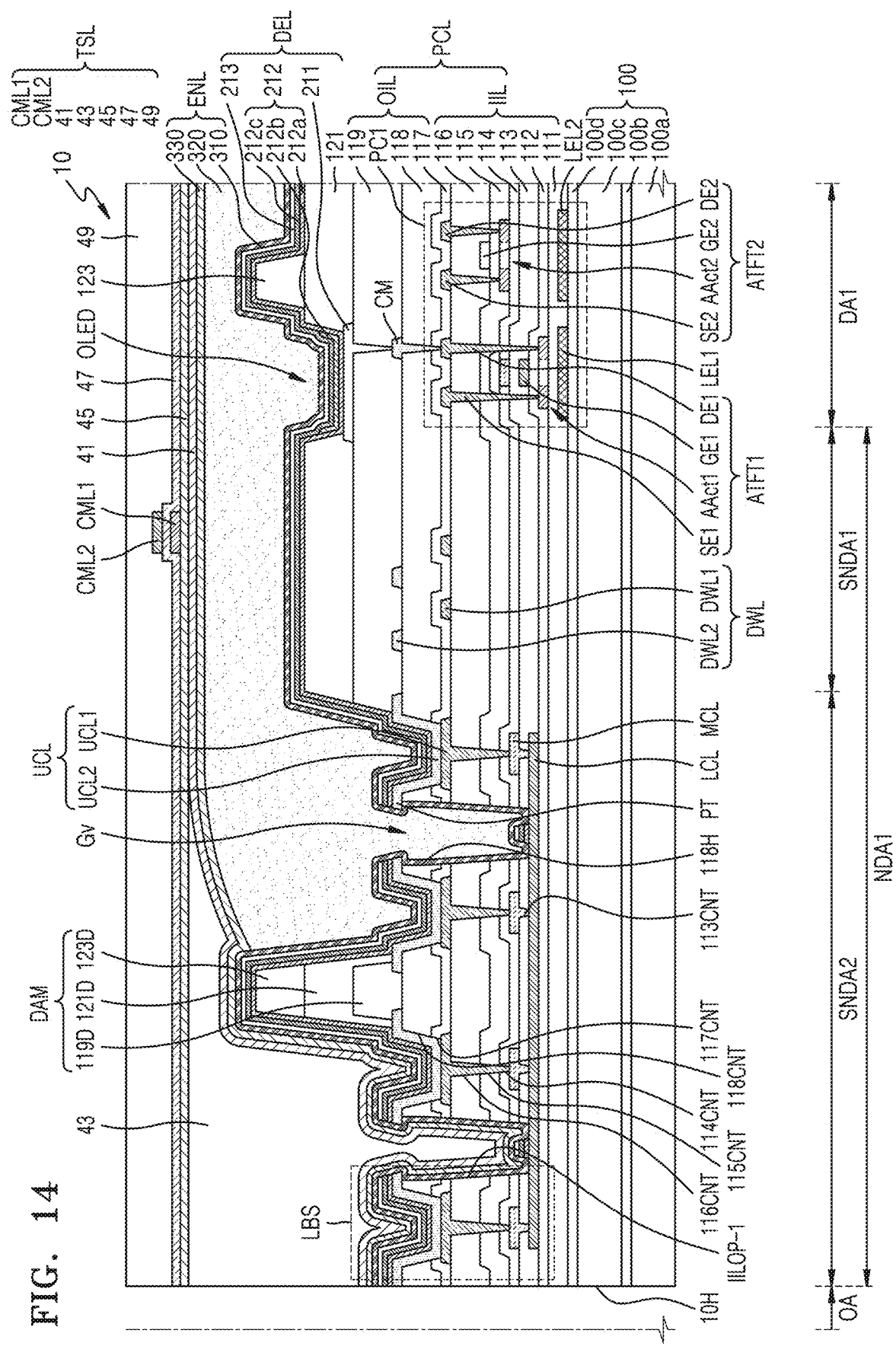
FIG. 14 is a schematic cross-sectional view of a display panel according to still another embodiment.

FIG. 14 is a schematic cross-sectional view of a display panel 10 according to still another embodiment. In FIG. 14, the same reference numerals as those of FIG. 13A denote the same members, and thus, repeated descriptions will be omitted.

Referring to FIG. 14, the display panel 10 may include a substrate 100, a pixel circuit layer PCL, a display element layer DEL, an encapsulation layer ENL, and a touch sensor layer TSL. The pixel circuit layer PCL, the display element layer DEL, the encapsulation layer ENL, and the touch sensor layer TSL may be sequentially stacked on the substrate 100.

The pixel circuit layer PCL may be arranged on the substrate 100. The pixel circuit layer PCL may include an inorganic insulating layer IIL, an organic insulating layer OIL, a first lower electrode layer LEL1, a second lower electrode layer LEL2, a first pixel circuit PC1, a connection electrode CM, and a detour line DWL. The inorganic insulating layer IIL may include a buffer layer 111, a first gate insulating layer 112, a second gate insulating layer 113, a first insulating layer 114, an intermediate insulating layer 115, a second insulating layer 116, and an inorganic layer 117.

The first non-display area NDA1 may include a first sub-non-display area SNDA1 and a second sub-non-display area SNDA2. The first sub-non-display area SNDA1 may be arranged farther from the opening area OA than the second sub-non-display area SNDA2. The second sub-non-display area SNDA2 may be arranged between the opening area OA and the first sub-non-display area SNDA1.

The inorganic insulating layer IIL and the first organic insulating layer 118 may be arranged on the second sub-non-display area SNDA2. The first insulating layer 114 may have a lower contact hole 114CNT overlapping the first non-display area NDA1 in a plan view. In an embodiment, the lower contact hole 114CNT may overlap the second sub-non-display area SNDA2. The second insulating layer 116 may include an upper contact hole 116CNT overlapping the first non-display area NDA1. In an embodiment, the upper contact hole 116CNT may overlap the second sub-non-display area SNDA2 in a plan view. In this case, the upper contact hole 116CNT may be connected to the lower contact hole 114CNT.

A lower conductive layer LCL may be arranged on the first non-display area NDA1. In an embodiment, the lower conductive layer LCL may be arranged on the second sub-non-display area SNDA2. The lower conductive layer LCL may overlap the lower contact hole 114CNT. In this case, the lower conductive layer LCL may be at least partially exposed by the lower contact hole 114CNT.

In an embodiment, one lower conductive layer LCL may overlap a plurality of lower contact holes 114CNT in a plan view. In this case, the lower conductive layer LCL may be at least partially exposed by the plurality of lower contact holes 114CNT.

In an embodiment, the first gate insulating layer 112, the second gate insulating layer 113, the first insulating layer 114, the intermediate insulating layer 115, the second insulating layer 116, and the inorganic layer 117 may have an inorganic insulating layer opening IILOP-1 between a plurality of adjacent second upper conductive layers UCL2. In an embodiment, a plurality of inorganic insulating layer openings IILOP-1 may be provided in the second sub-non-display area SNDA2. The inorganic insulating layer opening IILOP-1 may overlap the lower conductive layer LCL in a plan view. In this case, the inorganic insulating layer opening IILOP-1 may expose the lower conductive layer LCL.

The touch sensor layer TSL may be arranged on the encapsulation layer ENL. The touch sensor layer TSL may include a first touch insulating layer 41, a second touch insulating layer 43, a third touch insulating layer 45, a first touch conductive layer CML1, a fourth touch insulating layer 47, a second touch conductive layer CML2, and a fifth touch insulating layer 49.

The first touch insulating layer 41 may be arranged on the second inorganic encapsulation layer 330. In an embodiment, the first touch insulating layer 41 may be arranged along the shape of the second inorganic encapsulation layer 330. In some embodiments, the first touch insulating layer 41 may be omitted.

The second touch insulating layer 43 may be arranged on the first touch insulating layer 41. The second touch insulating layer 43 may be arranged on the second sub-non-display area SNDA2. The upper surface of the second touch insulating layer 43 may be flat. The second touch insulating layer 43 may have a closed curve shape (e.g., a donut shape) surrounding the opening area OA. One side of the second touch insulating layer 43 may face the opening area OA, and the other side of the second touch insulating layer 43 may face the first display area DA1. In an embodiment, a portion of the second touch insulating layer 43 may overlap a portion of the organic encapsulation layer 320 in a plan view while covering an edge of the organic encapsulation layer 320.

The third touch insulating layer 45 may be arranged on the first touch insulating layer 41 and the second touch insulating layer 43. The third touch insulating layer 45 may be arranged on a flat upper surface of the second touch insulating layer 43.

The first touch insulating layer 41 and the third touch insulating layer 45 may each be a single layer or a multilayer including an inorganic material such as $SiN_x$, $SiO_2$, and/or SiON.

The second touch insulating layer 43 may include an organic insulating material. For example, the second touch insulating layer 43 may include a polymer-based material. The polymer-based material may be transparent. For example, the second touch insulating layer 43 may include silicon-based resin, acryl-based resin, epoxy-based resin, polyimide, polyethylene, or the like.

The first touch conductive layer CML1 and the second touch conductive layer CML2 may each include a conductive material, for example, a metal. For example, the first touch conductive layer CML1 and the second touch conductive layer CML2 may each include a conductive material including Mo, Al, Cu, Ti, or the like, and may be a multilayer or single layer including the conductive material. In an embodiment, the first touch conductive layer CML1 and the second touch conductive layer CML2 may each have a structure in which a Ti layer, an Al layer, and a Ti layer are sequentially stacked.

The first touch conductive layer CML1 and/or the second touch conductive layer CML2 may include a plurality of touch electrodes for sensing a touch input. In an embodiment, the touch sensor layer TSL may include touch electrodes extending in a first direction and touch electrodes extending in a second direction on a plane. The aforementioned touch electrodes may sense an input by using a mutual capacitance method and may be provided on the first touch conductive layer CML1 and/or the second touch conductive layer CML2. In another embodiment, the touch electrodes may sense an input by using a self-capacitance method and may be provided on the first touch conductive layer CML1 or the second touch conductive layer CML2.

A fourth touch insulating layer 47 may be arranged between the first touch conductive layer CML1 and the second touch conductive layer CML2. The fourth touch insulating layer 47 may be a single layer or a multilayer including an inorganic material such as $SiN_x$, $SiO_2$, and/or SiON.

FIG. 14 illustrates that the touch sensor layer TSL includes the first touch conductive layer CML1 and the second touch conductive layer CML2. However, in another embodiment, the touch sensor layer TSL may include any one of the conductive layer CML1 and the second touch conductive layer CML2.

The fifth touch insulating layer 49 may be arranged on the second touch conductive layer CML2. In an embodiment, the upper surface of the fifth touch insulating layer 49 may be flat. The fifth touch insulating layer 49 may include an organic insulating material. For example, the fifth touch insulating layer 49 may include a polymer-based material. The polymer-based material may be transparent. For example, the fifth touch insulating layer 49 may include silicon-based resin, acryl-based resin, epoxy-based resin, polyimide, polyethylene, or the like.

As described above, embodiments of the disclosure may include a lower conductive layer and an upper conductive layer connected to the lower conductive layer through a contact hole, as a light-blocking structure, thereby improving the reliability of a display device.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. A display device comprising:
a substrate including an opening area, a display area surrounding the opening area, and a non-display area arranged between the opening area and the display area;
a first thin-film transistor arranged on the substrate and including a first semiconductor layer including a silicon semiconductor;
a first insulating layer covering the first semiconductor layer and defining a lower contact hole, the lower contact hole overlapping the non-display area in a plan view;
a second thin-film transistor arranged on the first insulating layer and including a second semiconductor layer including an oxide semiconductor;
a second insulating layer covering the second semiconductor layer and defining an upper contact hole, the upper contact hole overlapping the lower contact hole in the plan view;
a display element overlapping the display area in the plan view and arranged on the second insulating layer;
a lower conductive layer arranged between the substrate and the first insulating layer and overlapping the lower contact hole;
an upper conductive layer arranged on the second insulating layer and connected to the lower conductive layer through the lower contact hole and the upper contact hole;
a first organic insulating layer arranged between the second insulating layer and the display element; and
a second organic insulating layer arranged between the first organic insulating layer and the display element,
wherein the upper conductive layer includes a plurality of first upper conductive layers and a plurality of second upper conductive layers,
the first upper conductive layers are arranged between the second insulating layer and the first organic insulating layer,
the second upper conductive layers are arranged between the first organic insulating layer and the second organic insulating layer, and
the first upper conductive layer and the second upper conductive layer are alternately arranged in a direction from the display area to the opening area.
2. The display device of claim 1, wherein the first thin-film transistor is arranged between the second thin-film transistor and the opening area.
3. The display device of claim 1, further comprising:
a buffer layer arranged between the substrate and the first semiconductor layer; and
a first gate insulating layer covering the first semiconductor layer and arranged under the first insulating layer,
wherein the lower conductive layer includes at least one of a first lower conductive layer and a second lower conductive layer,
the first lower conductive layer is arranged between the substrate and the buffer layer, and
the second lower conductive layer is arranged between the first gate insulating layer and the first insulating layer.
4. The display device of claim 1,
wherein the first organic insulating layer define a hole arranged between two adjacent second upper conductive layers from among the plurality of second upper conductive layers, and
the two adjacent second upper conductive layers have a pair of protruding tips protruding toward a center of the hole of the first organic insulating layer.
5. The display device of claim 4, further comprising:
an encapsulation layer covering the display element and including at least one inorganic encapsulation layer and at least one organic encapsulation layer,
wherein the display element includes a first electrode arranged on the second organic insulating layer, an intermediate layer including an emission layer, and a second electrode, and
the intermediate layer further includes at least one of a first functional layer arranged between the first electrode and the emission layer and a second functional layer arranged between the emission layer and the second electrode,
wherein at least one of the first functional layer and the second functional layer is disconnected by the hole, and
the inorganic encapsulation layer is in direct contact with the pair of protruding tips.
6. The display device of claim 1, wherein the upper conductive layer includes an upper detour line extending to surround at least part of the opening area, and
the lower conductive layer includes a lower detour line extending to surround at least part of the opening area.
7. The display device of claim 1, wherein the upper conductive layer includes an upper wiring line extending from the display area to the non-display area and electrically connected to one of the first thin-film transistor and the second thin-film transistor, and
the lower conductive layer includes a lower wiring line extending to surround at least part of the opening area and electrically connected to the upper conductive layer in the non-display area.
8. The display device of claim 1, wherein the upper conductive layer includes an upper connection line that transmits an initialization voltage, and the lower conductive layer includes a lower connection line electrically connected to the upper connection line, wherein the upper connection line and the lower connection line extend to surround at least part of the opening area.

9. The display device of claim 1, wherein the lower conductive layer includes a dummy semiconductor layer including a silicon semiconductor.

10. The display device of claim 1, further comprising:
an intermediate insulating layer arranged between the first insulating layer and the second insulating layer;
a wiring line arranged between the intermediate insulating layer and the second insulating layer in the display area; and
a lower electrode layer arranged between the substrate and the second semiconductor layer,
wherein the lower electrode layer and the wiring line are electrically connected to each other through a hole in the first insulating layer and a hole in the intermediate insulating layer.

11. The display device of claim 1, further comprising a component overlapping the opening area in the plan view.

12. A display device comprising:
a substrate including an opening area, a display area surrounding the opening area, and a non-display area arranged between the opening area and the display area;
a pixel circuit arranged on the display area and including a first thin-film transistor including a first semiconductor layer including a silicon semiconductor and a second thin-film transistor including a second semiconductor layer disposed on the first semiconductor layer and including an oxide semiconductor;
a display element electrically connected to the pixel circuit;
a light-blocking structure arranged on the non-display area and surrounding at least a portion of the opening area;
a first organic insulating layer arranged between the second semiconductor layer and the display element;
a second organic insulating layer arranged between the first organic insulating layer and the display element;
a plurality of first upper conductive layers arranged between the second semiconductor layer and the first organic insulating layer; and
a plurality of second upper conductive layers arranged between the first organic insulating layer and the second organic insulating layer,
wherein the first upper conductive layer and the second upper conductive layer are alternately arranged in a direction from the display area to the opening area.

13. The display device of claim 12, further comprising:
a first insulating layer covering the first semiconductor layer, arranged under the second semiconductor layer, and defining a lower contact hole, the lower contact hole overlapping the non-display area in a plan view; and
a second insulating layer covering the second semiconductor layer and defining an upper contact hole, the upper contact hole overlapping the lower contact hole in the plan view, wherein the light-blocking structure includes:
a lower conductive layer arranged between the substrate and the first insulating layer and overlapping the lower contact hole; and
an upper conductive layer arranged on the second insulating layer and connected to the lower conductive layer through the lower contact hole and the upper contact hole,
wherein the upper conductive layer includes the plurality of first upper conductive layers and the plurality of second upper conductive layers.

14. The display device of claim 13, wherein the display area includes a first display area surrounding the opening area and a second display area surrounding the first display area,
the pixel circuit includes a first pixel circuit arranged in the first display area and a second pixel circuit arranged in the second display area,
the first pixel circuit includes a first adjacent thin-film transistor including a first adjacent semiconductor layer including a silicon semiconductor and a second adjacent thin-film transistor including a second adjacent semiconductor layer including an oxide semiconductor, and
the first adjacent thin-film transistor is arranged closer to the opening area than the second adjacent thin-film transistor,
wherein the display device further comprises:
an intermediate insulating layer arranged between the first insulating layer and the second insulating layer;
a wiring line arranged between the intermediate insulating layer and the second insulating layer in the first display area; and
a lower electrode layer arranged between the substrate and the second adjacent semiconductor layer,
wherein the lower electrode layer and the wiring line are electrically connected to each other through a hole in the first insulating layer and a hole in the intermediate insulating layer.

15. The display device of claim 12, wherein the pixel circuit is provided in plural,
wherein the light-blocking structure includes a connection line electrically connected to each of the pixel circuits adjacent to the connection line and from among the plurality of pixel circuits.

16. The display device of claim 12, wherein the light-blocking structure includes a detour line surrounding at least a portion of the opening area.

17. The display device of claim 12, wherein the light-blocking structure includes a dummy circuit arranged on the non-display area and including a dummy thin-film transistor,
wherein the dummy thin-film transistor includes a dummy semiconductor layer including a silicon semiconductor.

18. The display device of claim 12, further comprising:
an upper wiring line extending from the pixel circuit to the non-display area; and
a detour line surrounding at least part of the opening area,
wherein the light-blocking structure electrically connects the upper wiring line to the detour line.

* * * * *